US012707633B2

(12) United States Patent
Lim et al.

(10) Patent No.: US 12,707,633 B2
(45) Date of Patent: Aug. 11, 2026

(54) INTEGRATED CIRCUIT DEVICE AND METHOD OF MANUFACTURING THE SAME

(71) Applicant: Samsung Electronics Co., Ltd., Suwon-si (KR)

(72) Inventors: Dongwon Lim, Suwon-si (KR); Inseok Baek, Suwon-si (KR); Sangbin Ahn, Suwon-si (KR); Seokyeong Choi, Suwon-si (KR); Seungyong Hong, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 404 days.

(21) Appl. No.: 18/466,357

(22) Filed: Sep. 13, 2023

(65) Prior Publication Data

US 2024/0107753 A1 Mar. 28, 2024

(30) Foreign Application Priority Data

Sep. 26, 2022 (KR) ........................ 10-2022-0121969

(51) Int. Cl.
*H10B 12/00* (2023.01)

(52) U.S. Cl.
CPC ........... *H10B 12/488* (2023.02); *H10B 12/50* (2023.02)

(58) Field of Classification Search
CPC .. H10B 12/00; H10B 12/0383; H10B 12/053; H10B 12/315; H10B 12/34; H10B 12/36;
(Continued)

(56) References Cited

U.S. PATENT DOCUMENTS 6,128,209 A 10/2000 Kuroki
9,177,962 B2 11/2015 Taniguchi
(Continued)

FOREIGN PATENT DOCUMENTS

KR 10-2004-0093299 A 11/2004
KR 10-2009-0044490 A 5/2009
(Continued)

OTHER PUBLICATIONS

Extended European Search Report dated Feb. 7, 2024 issued in European Patent Application No. 23199635.6-1212.

*Primary Examiner* — Brook Kebede
(74) *Attorney, Agent, or Firm* — Harness, Dickey & Pierce, P.L.C.

(57) ABSTRACT

An integrated circuit device including a first cell block on a substrate that includes a first cell area, a first dummy cell area surrounding the first cell area in a plan view, the first dummy cell area including first active regions and second active regions in an outer periphery of the first dummy cell area, the first active regions each having a first size and the second active regions each having a second size larger than the first size, first and second word lines extending in a first direction and alternating with each other in a second direction, each of the first word lines including a first landing area extending between a second active region and a first active region, the first active region being near and apart from the second active region in the second direction, and first word line contacts on the first landing area may be provided.

20 Claims, 13 Drawing Sheets

(58) Field of Classification Search

CPC ...... H10B 12/48; H10B 12/488; H10B 12/50; H10D 89/10; G11C 5/02; G11C 5/025; G11C 8/14; G11C 11/404

See application file for complete search history.

(56) References Cited

U.S. PATENT DOCUMENTS

| | | | | |
|---|---|---|---|---|
| 9,741,723 | B2 | 8/2017 | Tomoyama | |
| 11,211,120 | B2 | 12/2021 | Huang et al. | |
| 11,244,712 | B2 | 2/2022 | Kwon | |
| 2010/0109062 | A1 | 5/2010 | Kadoya | |
| 2014/0346652 | A1 | 11/2014 | Surthi et al. | |
| 2017/0323893 | A1* | 11/2017 | Kim | H10B 12/34 |
| 2020/0381436 | A1 | 12/2020 | Noh et al. | |
| 2022/0139927 | A1* | 5/2022 | Chang | H10B 12/315<br>257/296 |
| 2022/0189966 | A1* | 6/2022 | Jang | H10B 12/0335 |

FOREIGN PATENT DOCUMENTS

| | | | |
|---|---|---|---|
| KR | 10-2011-0001806 | A | 1/2011 |
| KR | 10-2021-0117112 | A | 9/2021 |

* cited by examiner

SWD_1
NP2
DM1
WL1
WL2
CEA
DMA
DM2
NP1
CL
SWD_2
DM2
DMA
CEA
DM1
SWD_1
SWDC
w11
w12
MCA2
SWD
MCA1
SWD
MCA2
SWD
MCA1
Y
Z
X

TILH 272 262 258 256 TIL 254 252 240 230 IAS LCT PCT 214 212 210

Figure 12:
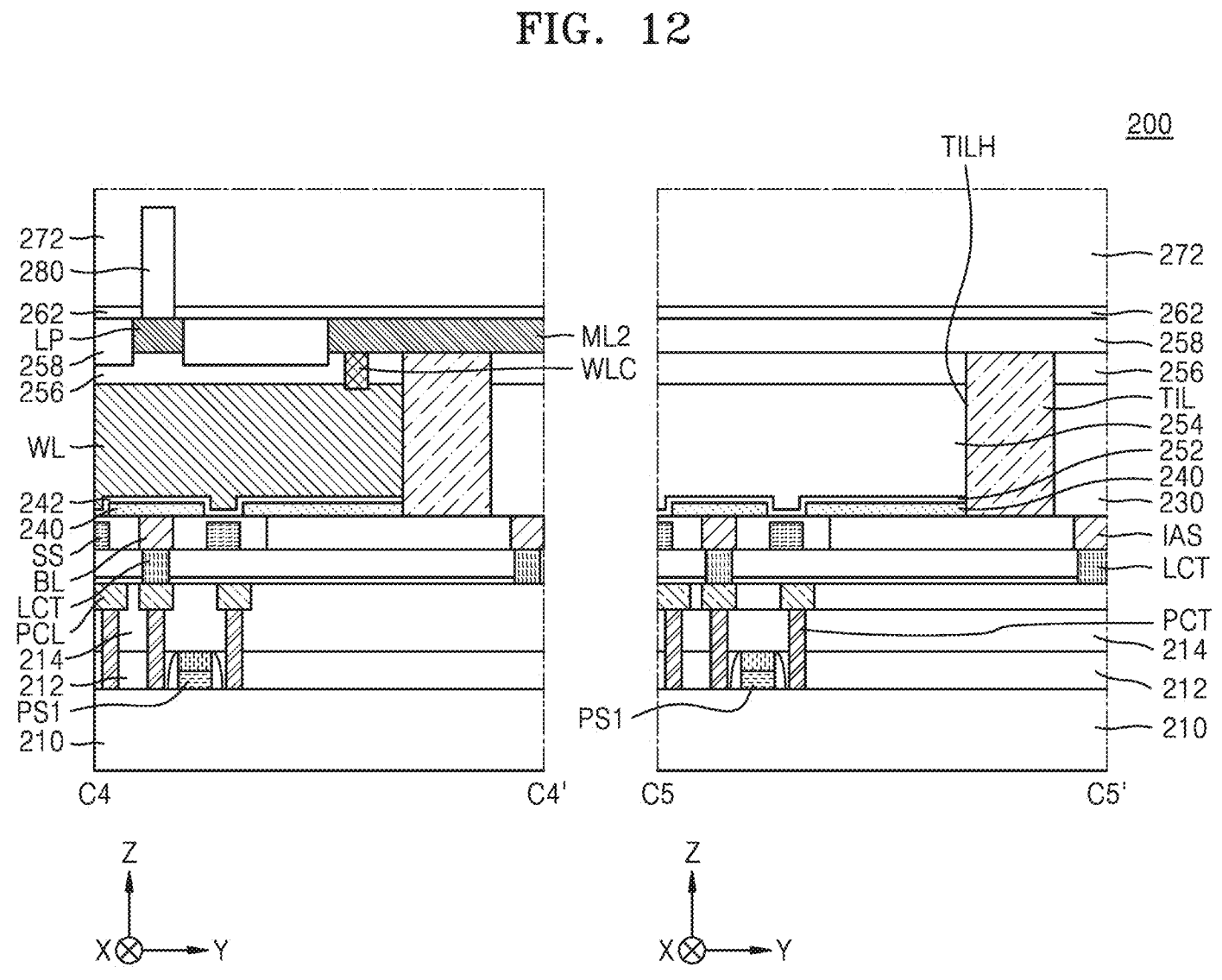

C5 C5'

PS1

ML2 WLC 272 280 262 LP 258 256 WL 242 240 SS BL LCT PCL 214 212 PS1 210

C4 C4'

Z Y X

INTEGRATED CIRCUIT DEVICE AND METHOD OF MANUFACTURING THE SAME

CROSS-REFERENCE TO RELATED APPLICATION

This application is based on and claims priority under 35 U.S.C. § 119 to Korean Patent Application No. 10-2022-0121969, filed on Sep. 26, 2022, in the Korean Intellectual Property Office, the disclosure of which is incorporated by reference herein in its entirety.

BACKGROUND

The inventive concepts relate to integrated circuit devices and/or methods of manufacturing the same, and more particularly, to integrated circuit devices including a cell capacitor and/or methods of manufacturing the same.

With the down-scaling of integrated circuit devices, the size of microcircuit patterns of integrated circuit devices is further decreasing. As the size of a microcircuit pattern decreases, failure may occur in a process of forming a narrow word line trench in a substrate.

SUMMARY

The inventive concepts provide integrated circuits device for preventing discreteness of a word line.

According to an aspect of the inventive concepts, an integrated circuit device includes a first cell block on a substrate, the first cell block including a first cell area, a first dummy cell area surrounding the first active regions, the first dummy cell areas including a plurality of first active regions and a plurality of second active regions in an outer periphery of the first dummy cell area, the first active regions each having a first size and the second active regions each having a second size larger than the first size, a plurality of first word lines and a plurality of second word lines in the first cell area and the first dummy cell area, the plurality of first word lines and the plurality of second word lines extending in a first horizontal direction and alternating with each other in a second horizontal direction, each of the plurality of first word lines including a first landing area extending between a first-second active region among the plurality of second active regions and a first-first active region among the plurality of first active regions, the first-first active region being near and spaced apart from the first-second active region in the second horizontal direction, and a plurality of first word line contacts in the first dummy cell area, each of the plurality of first word line contacts being on the first landing area of a corresponding one of the plurality of first word lines.

According to another aspect of the inventive concepts, an integrated circuit device includes a cell area on a substrate, a dummy cell area on the substrate, the dummy cell area including a first portion on a first side of the cell area and a second portion on a second side of the cell area, a plurality of first word lines and a plurality of second word lines in the cell area and the dummy cell area, the plurality of first word lines and the plurality of second word lines extending in a first horizontal direction and alternating with each other in a second horizontal direction, a plurality of first word line contacts in the first portion of the dummy cell area, the plurality of first word line contacts being on the plurality of first word lines, respectively, and a plurality of second word line contacts in the second portion of the dummy cell area, the plurality of second word line contacts being on the plurality of second word lines, respectively, wherein a first number of active regions arranged in the second horizontal direction in the first portion of the dummy cell area is different from a second number of active regions arranged in the second horizontal direction in the second portion of the dummy cell area.

According to a further aspect of the inventive concepts, an integrated circuit device includes a cell area on a substrate, a dummy cell area on the substrate, the dummy cell area including a first portion on a first side of the cell area and a second portion on a second side of the cell area, a plurality of first word lines and a plurality of second word lines in the cell area and the dummy cell area, the plurality of first word lines and the plurality of second word lines extending in a first horizontal direction and alternating with each other in a second horizontal direction, a plurality of first word line contacts in the first portion of the dummy cell area, the plurality of first word line contacts being on the plurality of first word lines, respectively, a plurality of second word line contacts in the second portion of the dummy cell area, the plurality of second word line contacts being on the plurality of second word lines, respectively, a first word line driver circuit unit near the first portion of the dummy cell area and electrically connected to the plurality of first word line contacts, and a second word line driver circuit unit near the second portion of the dummy cell area and electrically connected to the plurality of second word line contacts, wherein the number of active regions arranged in the second horizontal direction in the first portion of the dummy cell area is an even number, and the number of active regions arranged in the second horizontal direction in the second portion of the dummy cell area is an odd number.

BRIEF DESCRIPTION OF THE DRAWINGS

Example embodiments will be more clearly understood from the following detailed description taken in conjunction with the accompanying drawings in which:

FIG. 7 is a cross-sectional view taken along line B1-B1' in FIG. 5;

FIG. 8 is a cross-sectional view taken along line B2-B2' in FIG. 5;

FIG. 11 illustrates cross-sections respectively taken along lines C1-C1', C2-C2', and C3-C3' in FIG. 10;

FIG. 12 illustrates cross-sections respectively taken along lines C4-C4' and C5-C5' in FIG. 10.

DETAILED DESCRIPTION

Hereinafter, some example embodiments are described in detail with reference to the accompanying drawings.

Figure 1:
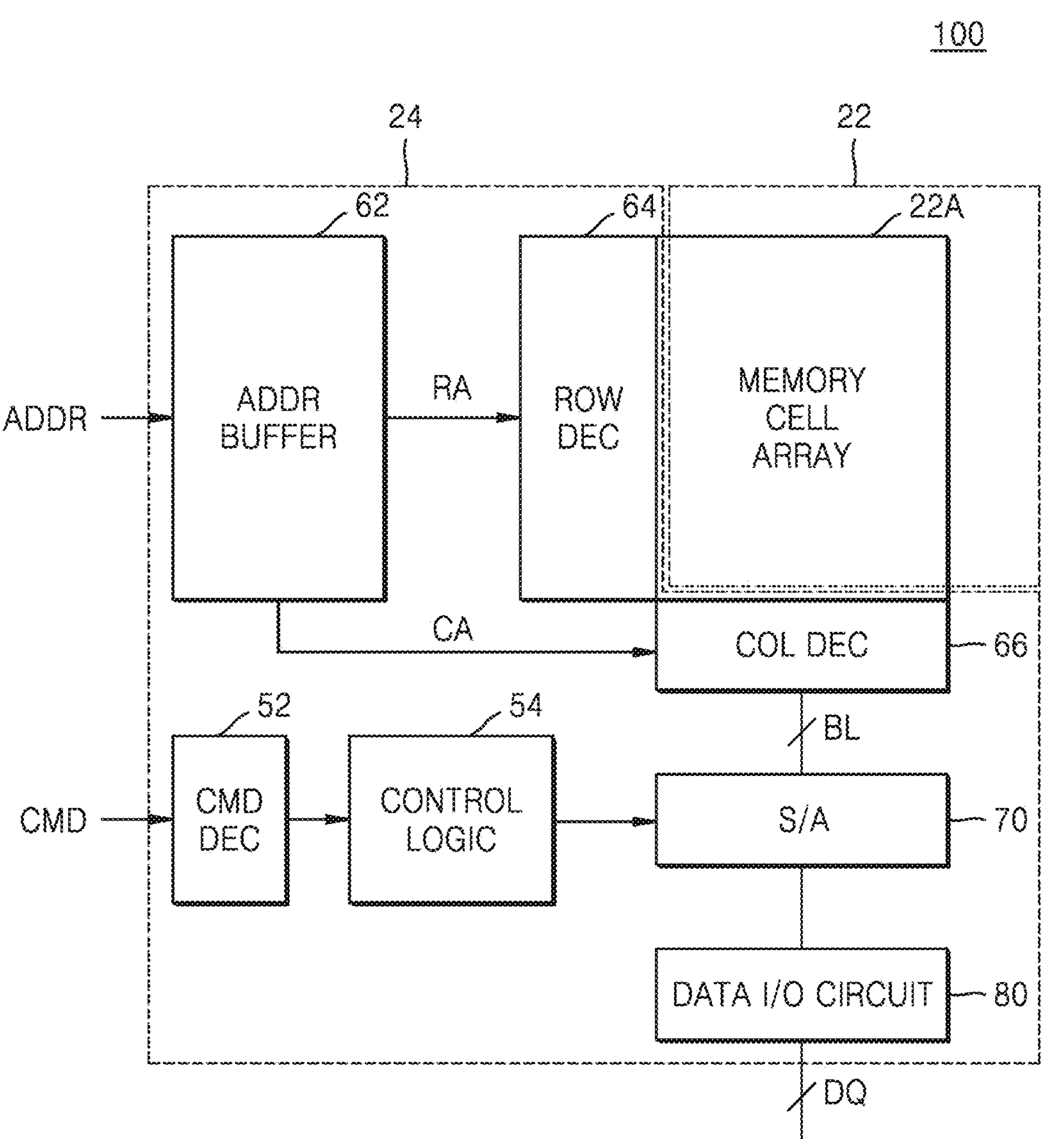
FIG. 1 is a block diagram of an integrated circuit device according to an example embodiment.

FIG. 1 is a block diagram of an integrated circuit device 100 according to an example embodiment.

Referring to FIG. 1, the integrated circuit device 100 may include a first area 22 and a second area 24. The integrated circuit device 100 may correspond to a semiconductor-based storage device. For example, the integrated circuit device 100 may include volatile memory such as dynamic random access memory (DRAM), synchronous DRAM (SDRAM), double data rate SDRAM (DDR SDRAM), low power DDR SDRAM (LPDDR SDRAM), graphics DDR SDRAM (GDDR SDRAM), DDR2 SDRAM, DDR3 SDRAM, DDR4 SDRAM, or thyristor RAM (TRAM), or non-volatile memory such as phase-change RAM (PRAM), magnetic RAM (MRAM), or resistive RAM (RRAM).

In some example embodiments, the first area 22 may correspond to a memory cell area of a DRAM device, and the second area 24 may correspond to a peripheral circuit area of the DRAM device. The first area 22 may include a memory cell array 22A.

The second area 24 may output data through data lines DQ in response to a command CMD, an address ADDR, and control signals, which are received from an external device (e.g., a memory controller). The integrated circuit device 100 may include a command decoder 52, a control logic 54, an address buffer 62, a row decoder 64, a column decoder 66, a sense amplifier 70, and a data input/output (I/O) circuit 80.

The memory cell array 22A may include a plurality of memory cells (MC in FIG. 3) in a matrix of rows and columns. The memory cell array 22A may include a plurality of word lines (WL1 to WLn in FIG. 3) and bit lines BL (BL1 to BLn in FIG. 3), which are connected to the memory cells. The word lines may be connected to rows of memory cells, respectively, and the bit lines BL may be connected to columns of memory cells, respectively.

The command decoder 52 may decode a write enable signal (/WE), a row address strobe signal (/RAS), a column address strobe signal (/CAS), a chip select signal (/CS), and the like, which are received from an external device (e.g., a memory controller) such that the control logic 54 generates control signals corresponding to the command CMD. The command CMD may include an active command, a read command, a write command, a precharge command, or the like.

The address buffer 62 may receive the address ADDR from an external device (e.g., a memory controller). The address ADDR may include a row address RA, which addresses a row of the memory cell array 22A, and a column address CA, which addresses a column of the memory cell array 22A. The address buffer 62 may transmit the row address RA to the row decoder 64 and the column address CA to the column decoder 66.

The row decoder 64 may select one of the word lines connected to the memory cell array 22A. The row decoder 64 may decode the row address RA received from the address buffer 62, select a word line corresponding to the row address RA, and activate the selected word line.

The column decoder 66 may select one of the bit lines BL of the memory cell array 22A. The column decoder 66 may decode the column address CA received from the address buffer 62 and select a bit line BL corresponding to the column address CA.

The sense amplifier 70 may be connected to the bit lines BL of the memory cell array 22A. The sense amplifier 70 may sense a voltage change in the selected one of the bit lines BL, amplify a voltage of the selected bit line, and output an amplified voltage. The data I/O circuit 80 may output data, which is output from the sense amplifier 70 based on the sensed and amplified voltage, to the outside through the data lines DQ.

Figure 2:
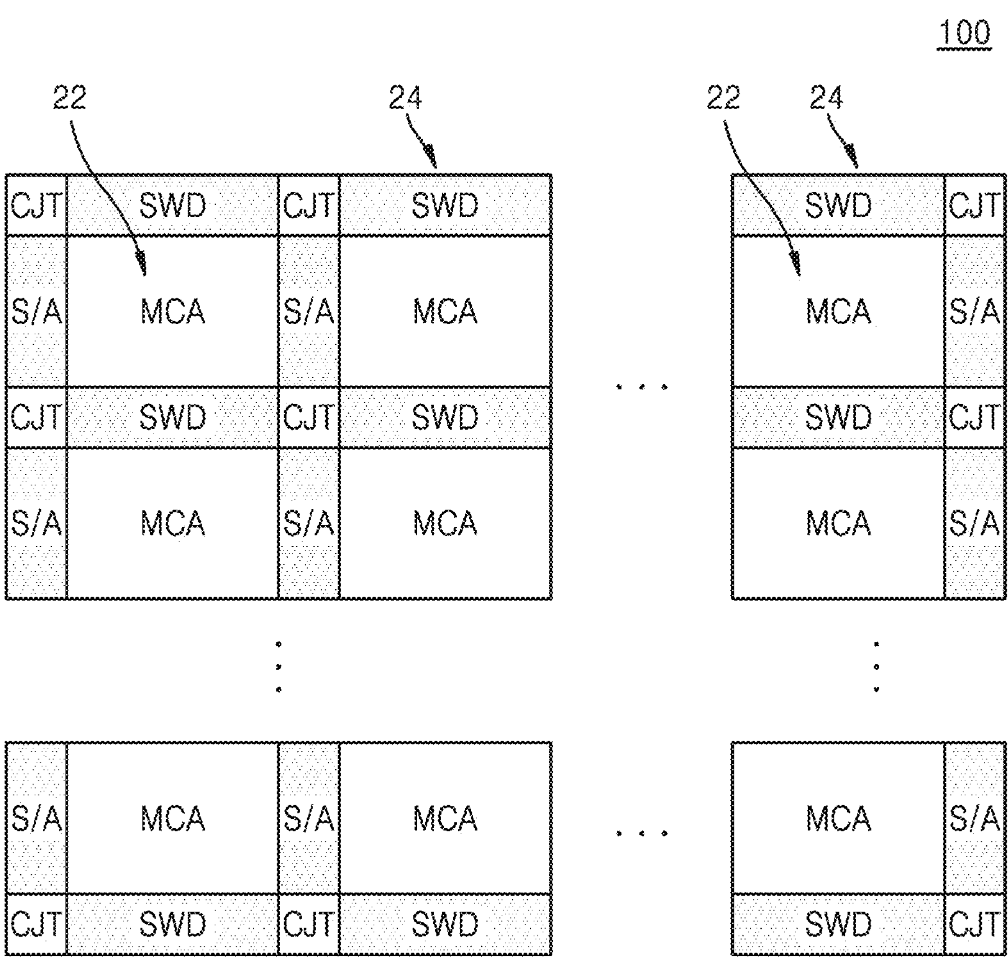
FIG. 2 is a plan view illustrating the configuration of an integrated circuit device, according to an example embodiment.
Figure 3:
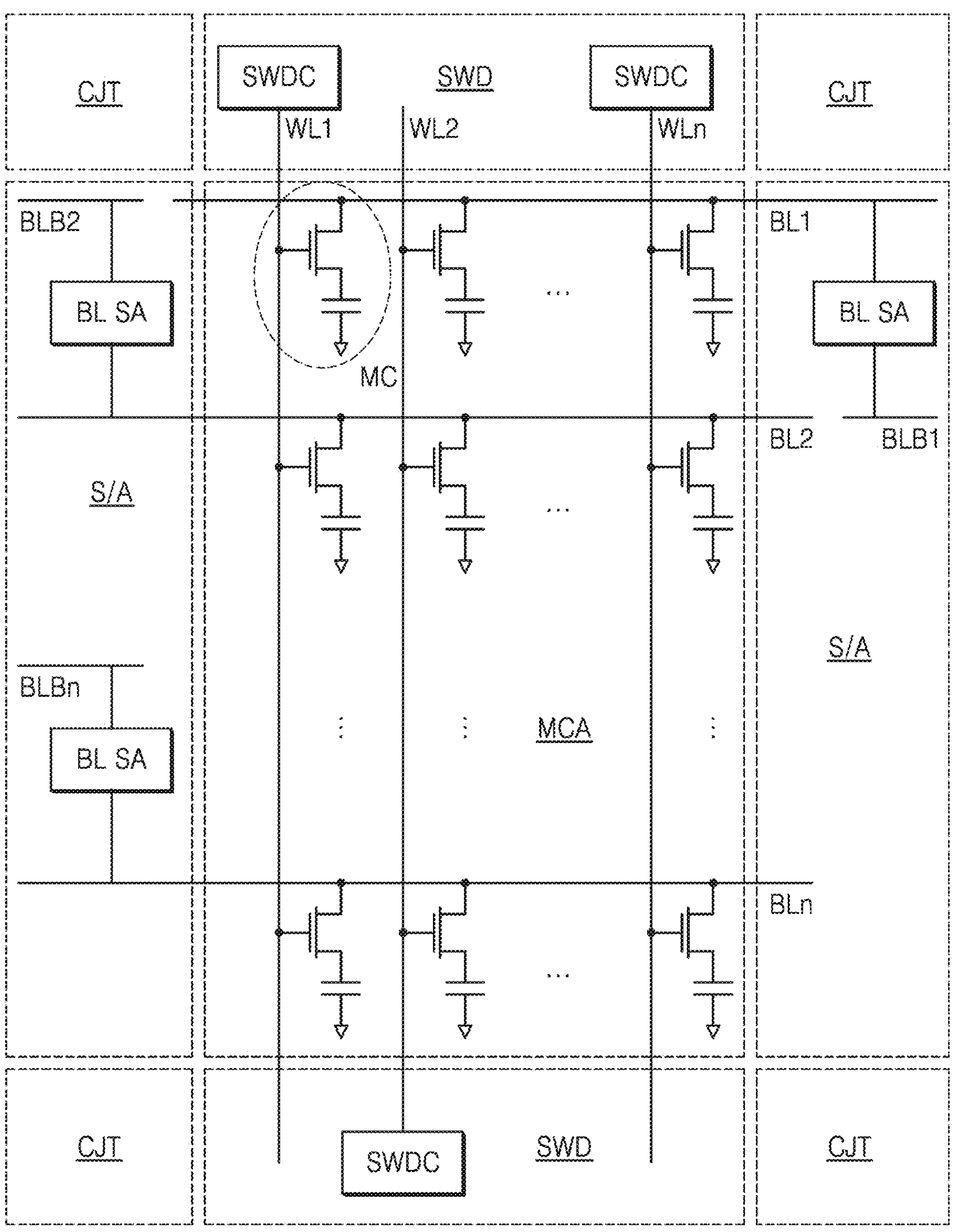
FIG. 3 is a diagram illustrating an example connection between a word line driver circuit and a memory cell in FIG. 2.

FIG. 2 is a plan view illustrating the configuration of the integrated circuit device 100, according to an example embodiment. FIG. 3 is a diagram illustrating an example connection between a word line driver circuit and a memory cell in FIG. 2.

Referring to FIGS. 2 and 3, each of a plurality of first areas 22 may be surrounded by the second area 24. In the example embodiment, each of the first areas 22 may correspond to a cell block MCA of a DRAM device, and the second area 24 may correspond to a core area and an area in which peripheral circuits of the DRAM device are formed (hereinafter, referred to as a peripheral circuit area).

The second area 24 may include a sub-word line driver block SWD, a sense amplifier block S/A, and a conjunction block CJT.

A word line driver circuit SWDC, which drives a word line to have a certain voltage level, may be arranged in the sub-word line driver block SWD. The word line driver circuit SWDC may be controlled by a word line driving signal output from the row decoder 64 in FIG. 1.

A plurality of sense amplifiers 70 (shown in FIG. 1) may be arranged in the sense amplifier block S/A. A plurality of bit line sense amplifiers BL SA may be arranged in the sense amplifier block S/A. Each of the bit line sense amplifiers BL SA may be connected to one of the bit lines BL1 to BLn, which is connected to memory cells MC in one of the columns of the cell block MCA, and one of complementary bit lines BLB1 to BLBn corresponding to the bit lines BL1 to BLn, respectively. Each of the bit line sense amplifiers BL SA may amplify data stored in the memory cell MC. For example, each of the bit line sense amplifiers BL SA may sense a voltage change in the selected one of the bit lines BL, amplify a voltage of the selected bit line, and output an amplified voltage.

The conjunction block CJT may be at an intersection between the sub-word line driver block SWD and the sense amplifier block S/A. Driving signal generation circuits applying driving voltages to the word lines WL1 to WLn, respectively, may be arranged in the conjunction block CJT. Power supply drivers and ground drivers, which drive the sense amplifier 70, may be alternately arranged in the conjunction block CJT.

Peripheral circuits, such as an inverter chain and an I/O circuit, may be further arranged in the second area 24.

Figure 4:
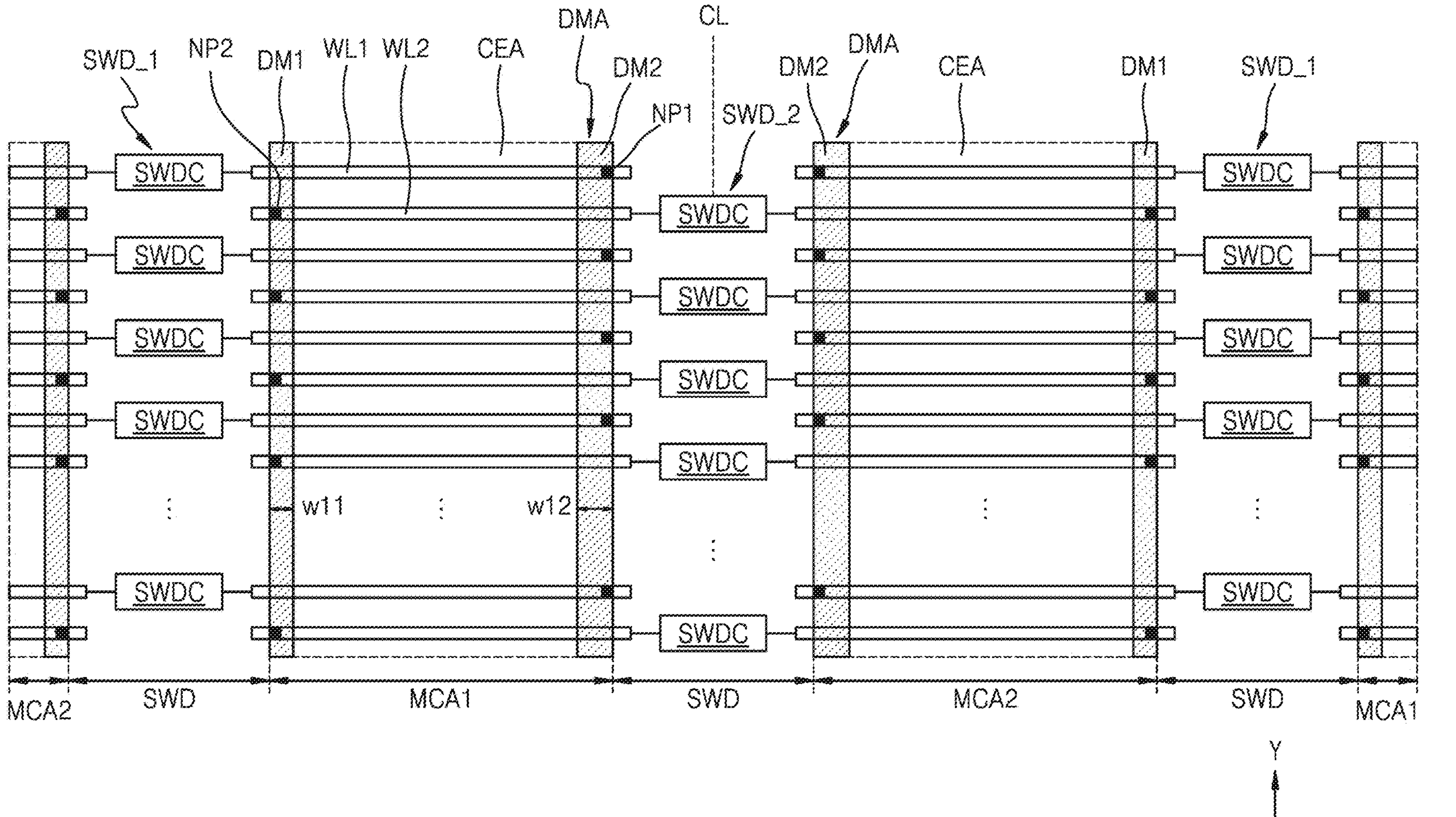
FIG. 4 is a schematic layout diagram of an integrated circuit device according to an example embodiment.
Figure 5:
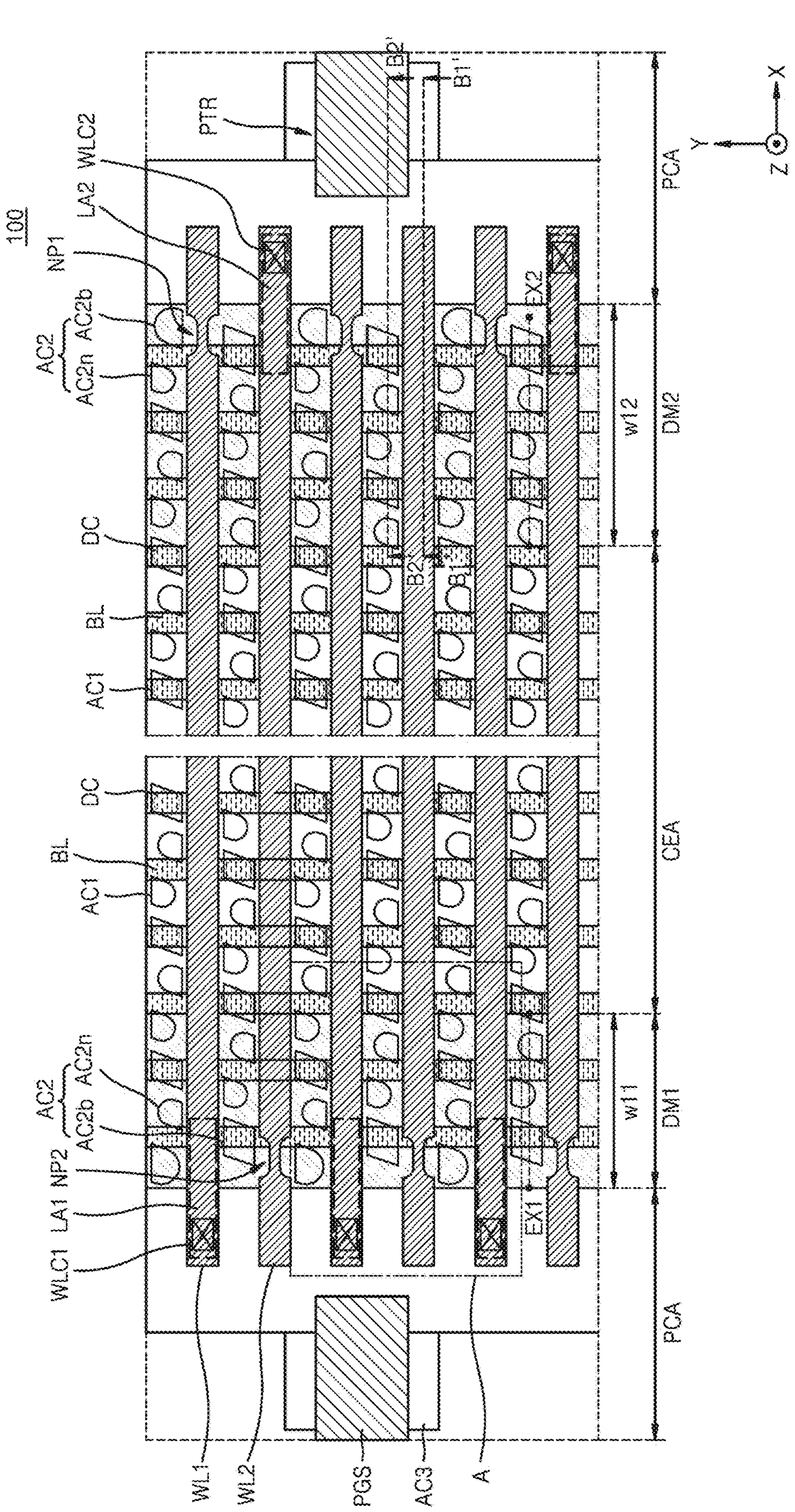
FIG. 5 is an enlarged layout diagram of a portion of a first cell block in FIG. 4.
Figure 6:
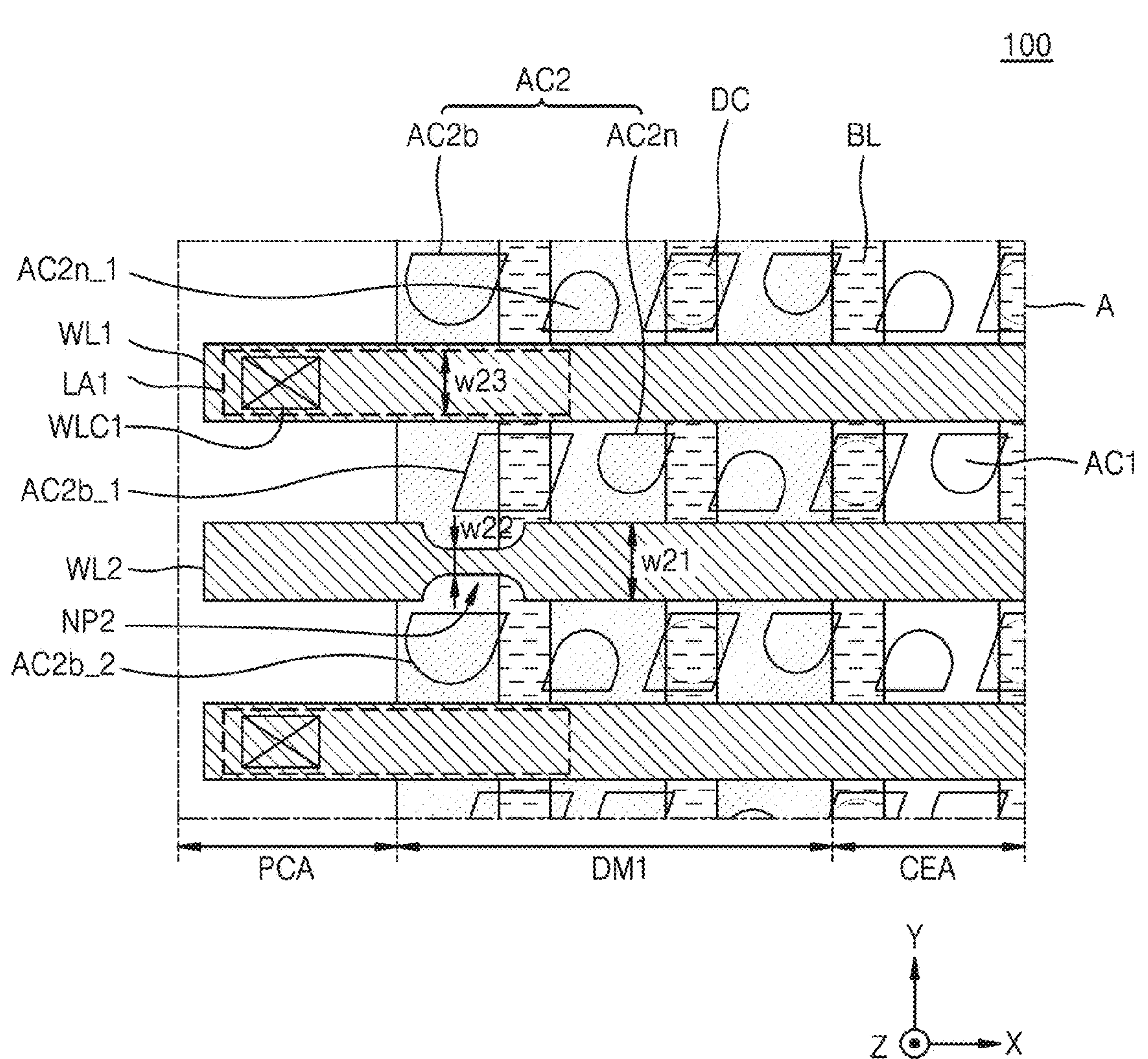
FIG. 6 is an enlarged view of a region A in FIG. 5.
Figure 7:
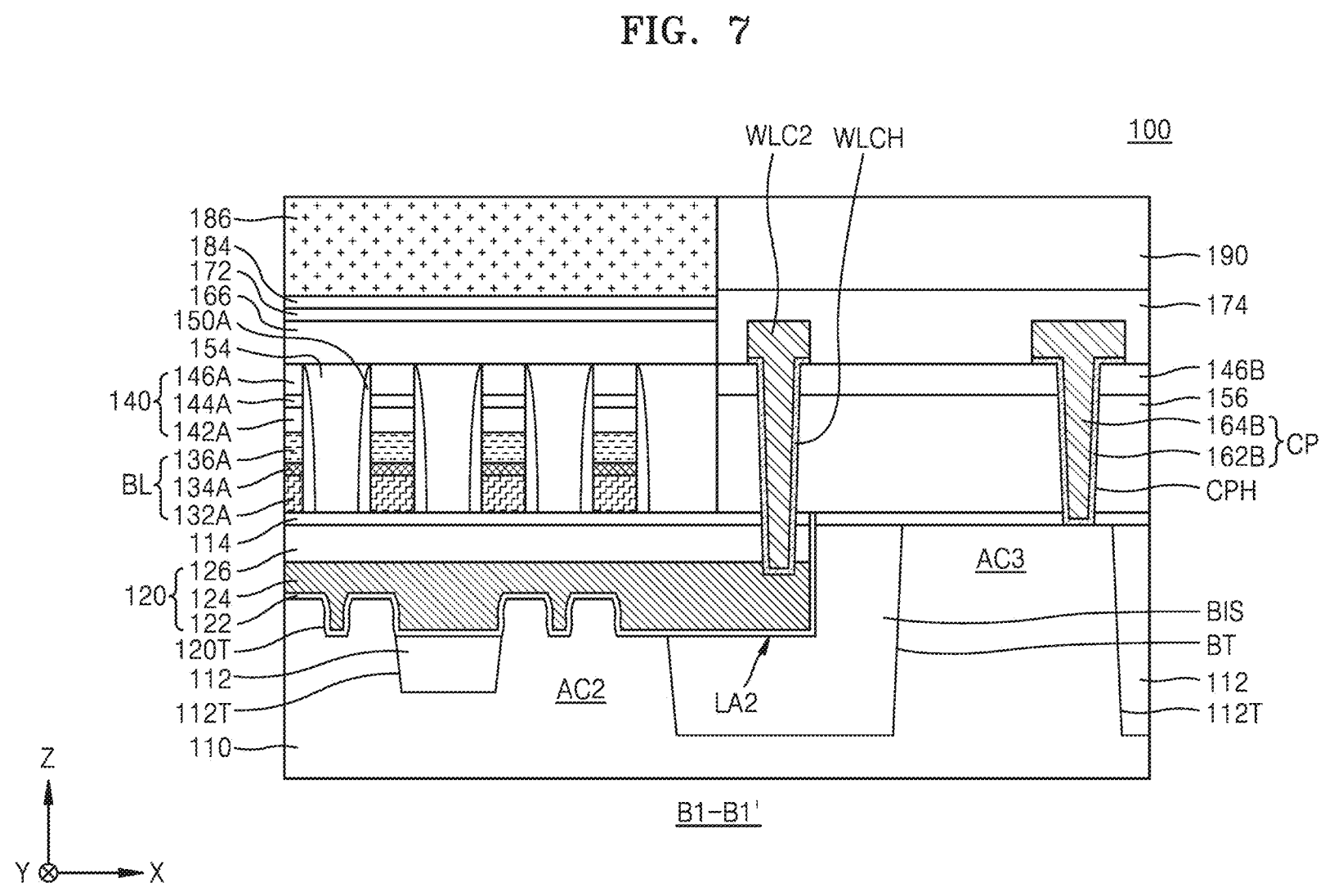
Figure 8:
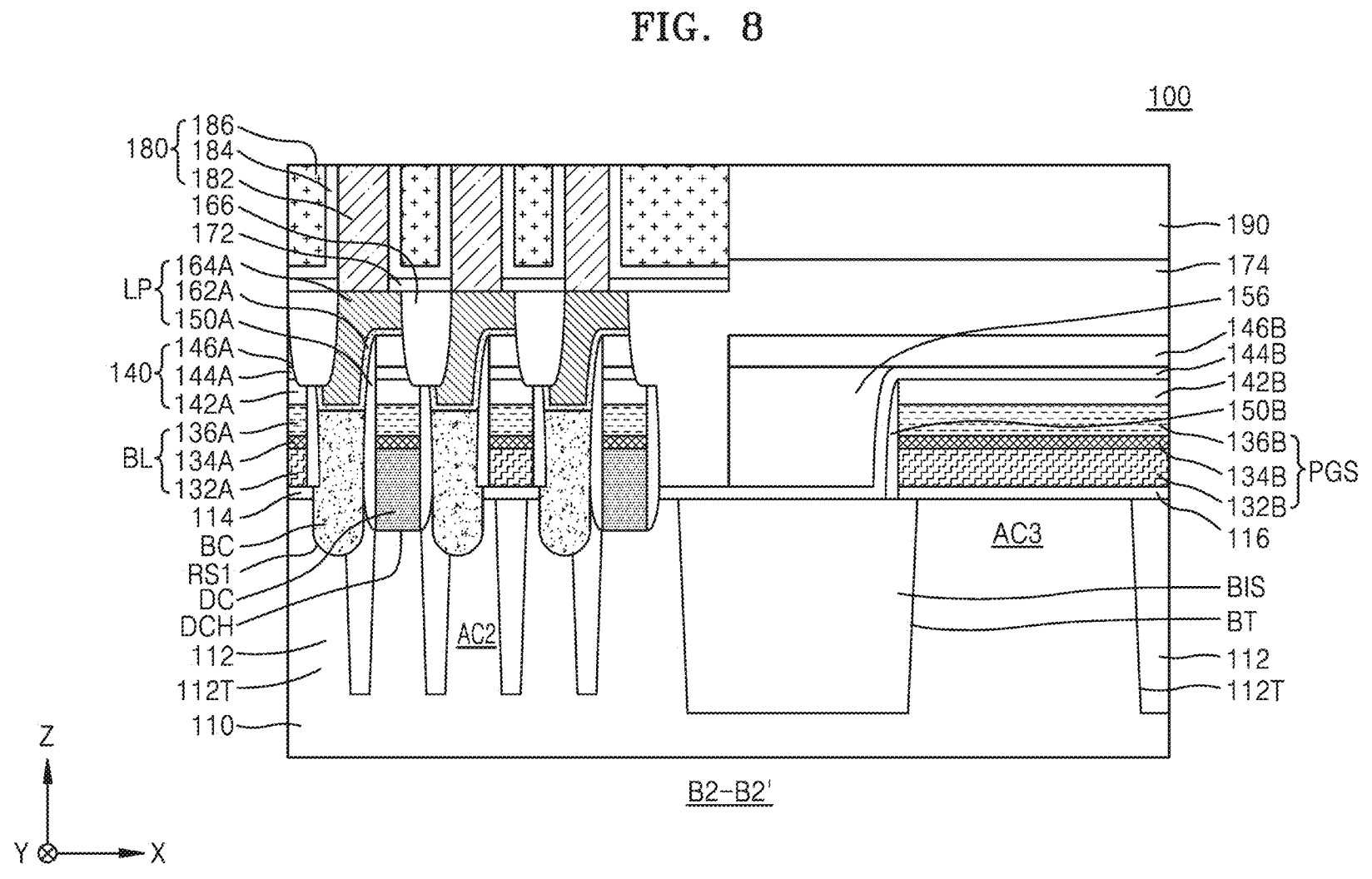

FIG. 4 is a schematic layout diagram of the integrated circuit device 100 according to an example embodiment. FIG. 5 is an enlarged layout diagram of a portion of a first cell block MCA1 in FIG. 4. FIG. 6 is an enlarged view of a region A in FIG. 5. FIG. 7 is a cross-sectional view taken along line B1-B1' in FIG. 5. FIG. 8 is a cross-sectional view taken along line B2-B2' in FIG. 5.

Referring to FIGS. 4 to 8, the integrated circuit device 100 may include first cell blocks MCA1 and second cell blocks MCA2, which are alternately disposed on a substrate 110. The first cell blocks MCA1 may alternate with the second cell blocks MCA2 in a first horizontal direction X. A first cell block MCA1 and a second cell block MCA2 may be arranged in mirror symmetry. For example, the first cell block MCA1 and the second cell block MCA2 may be mirror-symmetrical with respect to a center line CL between the first and second cell blocks MCA1 and MCA2 in the first horizontal direction X.

Each of the first and second cell blocks MCA1 and MCA2 may include a cell area CEA and a dummy cell area DMA, which is arranged at at least opposite sides of the cell area CEA. In some example embodiments, in a plan view, the dummy cell area DMA may be arranged to surround four sides of the cell area CEA. However, example embodiments are not limited thereto.

In some example embodiments, a first portion DM1 of the dummy cell area DMA may be on a first side of the first cell block MCA1, and a second portion DM2 of the dummy cell area DMA may be on a second side of the first cell block MCA1, the second side being opposite to the first side. For example, as shown in FIG. 4, the first portion DM1 of the dummy cell area DMA may be on the left side of the first cell block MCA1, and the second portion DM2 of the dummy cell area DMA may be on the right side of the first cell block MCA1. The first and second cell blocks MCA1 and MCA2 may be arranged in mirror symmetry. Accordingly, the first portion DM1 of the dummy cell area DMA may be on the right side of the second cell block MCA2, and the second portion DM2 of the dummy cell area DMA may be on the left side of the second cell block MCA2.

The first portion DM1 of the dummy cell area DMA may have a first width w11 in the first horizontal direction X, and the second portion DM2 of the dummy cell area DMA may have a second width w12 that is greater than the first width w11 in the first horizontal direction X. Because the first and second portions DM1 and DM2 of the dummy cell area DMA at opposite sides of the cell area CEA have different widths from each other, the first and second cell blocks MCA1 and MCA2 may be asymmetrical.

Sub-word line driver blocks SWD may be arranged between the first cell blocks MCA1 and the second cell blocks MCA2. The sub-word line driver blocks SWD may include a first word line driver circuit unit SWD_1 and a second word line driver circuit unit SWD_2. The first word line driver circuit unit SWD_1 may be between a first cell block MCA1 and a second cell block MCA2 disposed to the left side of the first cell block MCA1, and the second word line driver circuit unit SWD_2 may be between the first cell block MCA1 and a second cell block MCA2 disposed to the right side of the first cell block MCA1.

For example, the first word line driver circuit unit SWD_1 may be near the first portion DM1 of the dummy cell area DMA and between the first cell block MCA1 and the second cell block MCA2 disposed to the left side of the first cell block MCA1. For example, the first word line driver circuit unit SWD_1 may be between the first portion DM1 of the dummy cell area DMA of the first cell block MCA1 and the first portion DM1 of the dummy cell area DMA of the second cell block MCA2 disposed to the left side of the first cell block MCA1. The second word line driver circuit unit SWD_2 may be near the second portion DM2 of the dummy cell area DMA and between the first cell block MCA1 and the second cell block MCA2 to the right side of the first cell block MCA1. For example, the second word line driver circuit unit SWD_2 may be between the second portion DM2 of the dummy cell area DMA of the first cell block MCA1 and the second portion DM2 of the dummy cell area DMA of the second cell block MCA2 disposed to the right side of the first cell block MCA1.

The substrate 110 may include silicon (e.g., monocrystalline silicon, polycrystalline silicon, or amorphous silicon). In some example embodiments, the substrate 110 may include at least one selected from the group consisting of Ge, SiGe, SiC, GaAs, InAs, and InP. In some example embodiments, the substrate 110 may include a conductive region (e.g., an impurity-doped well or an impurity-doped structure). Isolation films 112 may include an oxide film, a nitride film, or a combination thereof.

Isolation trenches 112T may be formed in the substrate 110, and the isolation films 112 may be in the isolation trenches 112T, respectively. By the isolation films 112, a plurality of first active regions AC1 may be defined in the cell area CEA, a plurality of second active regions AC2 may be defined in the dummy cell area DMA, and a plurality of third active regions AC3 may be defined in a peripheral circuit area PCA. A plurality of memory cells (MC in FIG. 3) may be arranged in the cell area CEA, and a peripheral transistor PTR may be arranged in the peripheral circuit area PCA.

The peripheral circuit area PCA may include a sub-word line driver block SWD, a sense amplifier block S/A, and a conjunction block CJT (see FIG. 3). The peripheral transistor PTR including the word line driver circuit SWDC, the sense amplifier 70 (in FIG. 1), driving signal generation circuits, power supply drivers, ground drivers, an I/O circuit, and/or the like may be arranged in the peripheral circuit area PCA.

Each of the first active regions AC1 in the cell area CEA and the second active regions AC2 in the dummy cell area DMA may have a long axis in a direction diagonal to both the first horizontal direction X and a second horizontal direction Y.

In some example embodiments, the second active regions AC2 may include a plurality of normal active regions AC2*n* and a plurality of big active regions AC2*b*. The big active region AC2*b* has a larger area than the normal active region AC2*n*. Some of the big active regions AC2*b* may be arranged in an outermost periphery of the first portion DM1 of the dummy cell area DMA, and the other big active regions AC2*b* may be arranged in an outermost periphery of the second portion DM2 of the dummy cell area DMA. For example, the big active regions AC2*b* may be closer to the peripheral circuit area PCA than the normal active regions AC2*n*, among the second active regions AC2 such that the big active regions AC2*b* are arranged between the peripheral circuit area PCA and the normal active regions AC2*n*.

In some example embodiments, each of the big active regions AC2*b* may have a larger area than each of the first active regions AC1 and the normal active regions AC2*n*. For example, a width in the first horizontal direction X of each big active region AC2*b* may be greater than a width in the first horizontal direction X of each of the first active regions AC1 and the normal active regions AC2*n*. A plurality of big active regions AC2*b* may include a first big active region AC2*b*_1 and a second big active region AC2*b*_2, which are alternately arranged in the second horizontal direction Y. Each of the first big active region AC2*b*_1 and the second big active region AC2*b*_2 may have a larger size than each of the normal active regions AC2*n*. For example, as shown in FIG. 6, the first big active region AC2*b*_1 may have a parallelogram horizontal cross-section, and the second big active region AC2*b*_2 may have a cut oval horizontal cross-section (e.g., a horizontal cross-section having a shape including a first side being a straight line and a second side being curved).

A plurality of first word lines WL1 and a plurality of second word lines WL2 may extend in parallel with each other in the first horizontal direction X and alternate with each other in the second horizontal direction Y in the cell area CEA and the dummy cell area DMA.

In some example embodiments, each of the first word lines WL1 may include a first landing area LA1 in the first portion DM1 of the dummy cell area DMA, and a first word line contact WLC1 may be on the first landing area LA1. Each first word line WL1 may be electrically connected to the word line driver circuit SWDC of the first word line driver circuit unit SWD_1 by the first word line contact WLC1.

In some example embodiments, each of the second word lines WL2 may include a second landing area LA2 in the second portion DM2 of the dummy cell area DMA, and a second word line contact WLC2 may be on the second landing area LA2. Each second word line WL2 may be electrically connected to the word line driver circuit SWDC of the second word line driver circuit unit SWD_2 by the second word line contact WLC2.

In some example embodiments, the first word line WL1 may include a first neck portion NP1 in the second portion DM2 of the dummy cell area DMA, and the second word line WL2 may include a second neck portion NP2 in the first portion DM1 of the dummy cell area DMA. As shown in FIG. 6, each of the first and second word lines WL1 and WL2 may have a first width w21 in the second horizontal direction Y, and each of the first and second neck portions NP1 and NP2 may have a second width w22 in the second horizontal direction Y, which is less than the first width w21.

In some example embodiments, the second width w22 of each of the first and second neck portions NP1 and NP2 may be less than 50%, 30%, or 20% of the first width w21 of each of the first and second word lines WL1 and WL2. In this case, the first neck portion NP1 may be referred to as a discrete portion (e.g., a narrowed portion) of the first word line WL1, and the second neck portion NP2 may be referred to as a discrete portion (e.g., a narrowed portion) of the second word line WL2.

In some example embodiments, each of the first and second word lines WL1 and WL2 may include a gate structure 120, which extends in the first horizontal direction X and arranged in a plurality of word line trenches 120T. The gate structure 120 may include a gate dielectric film 122 in the word line trenches 120T, a gate electrode 124, and a gate capping layer 126. The gate dielectric film 122 may include a silicon oxide film, a silicon nitride film, a silicon oxynitride film, an oxide/nitride/oxide (ONO) film, or a high-k dielectric film having a higher dielectric constant than a silicon oxide film. The gate electrode 124 may include Mo, La, LaO, Ru, Ti, TiN, Ta, TaN, W, WN, TiSiN, WSiN, polysilicon, or a combination thereof. The gate capping layer 126 may include a silicon oxide film, a silicon nitride film, a silicon oxynitride film, or a combination thereof.

The first landing area LA1 of the first word line WL in the first portion DM1 of the dummy cell area DMA may be between a big active region AC2*b* (e.g., the first big active region AC2*b*_1 in FIG. 6) and a normal active region AC2*n* (e.g., a first normal active region AC2*n*_1 in FIG. 6), which is near and separated from the first big active region AC2*b*_1 in the second horizontal direction Y, and extend toward an end of the first word line WL1 in the first horizontal direction X. The first landing area LA1 may have a relatively large width. For example, the first landing area LA1 may have a third width w23 in the second horizontal direction Y and may be greater than the second width w22 in the second horizontal direction Y of the first neck portion NP1.

The second neck portion NP2 of the second word line WL2 in the first portion DM1 of the dummy cell area DMA may be between a big active region AC2*b* (e.g., the first big active region AC2*b*_1 in FIG. 6) and another big active region AC2*b* (e.g., the second big active region AC2*b*_2 in FIG. 6), which is near and separated from the first big active region AC2*b*_1 in the second horizontal direction Y.

In some example embodiments, during manufacturing processes, big active regions AC2*b* may be formed in an outermost periphery of the dummy cell area DMA due to the loading effect of a mask process, and the etching amount of the substrate 110 may be relatively reduced in a process of forming a word line trench 120T between two adjacent big active regions AC2*b* (e.g., the first big active region AC2*b*_1 and the second big active region AC2*b*_2). Accordingly, the width of a portion of the word line trench 120T between two adjacent big active regions AC2*b* (e.g., the first big active region AC2*b*_1 and the second big active region AC2*b*_2) may be reduced, and the first and second neck portions NP1 and NP2 may be formed.

As described above, the first portion DM1 of the dummy cell area DMA may have the first width w11 in the first horizontal direction X, and the second portion DM2 of the dummy cell area DMA may have the second width w12 in the first horizontal direction X, which is greater than the first width w11. Accordingly, the number of second active regions AC2 arranged in the first horizontal direction X in the first portion DM1 of the dummy cell area DMA may be different from the number of second active regions AC2 arranged in the first horizontal direction X in the second portion DM2 of the dummy cell area DMA.

In some example embodiments, the number of second active regions AC2 arranged in the first horizontal direction X in the first portion DM1 of the dummy cell area DMA may be one less than the number of second active regions AC2 arranged in the first horizontal direction X in the second portion DM2 of the dummy cell area DMA. For example, the number of second active regions AC2 arranged in the first horizontal direction X in the first portion DM1 of the dummy cell area DMA may be an even number, and the number of second active regions AC2 arranged in the first horizontal direction X in the second portion DM2 of the dummy cell area DMA may be an odd number. For example, the number of second active regions AC2 crossing a first extension line EX1 extending in the first horizontal direction X in the first portion DM1 of the dummy cell area DMA may be four, and the number of second active regions AC2 crossing a second extension line EX2 extending in the first horizontal direction X in the second portion DM2 of the dummy cell area DMA may be five. Alternatively, the number of second active regions AC2 arranged in the first horizontal direction X in the first portion DM1 of the dummy cell area DMA may be an odd number, and the number of second active regions AC2 arranged in the first horizontal direction X in the second portion DM2 of the dummy cell area DMA may be an even number.

A plurality of bit lines BL may extend in the second horizontal direction Y over the first and second word lines WL1 and WL2 and may be parallel with each other. Each of the bit lines BL may be connected to a first active region AC1 through a direct contact DC.

As described above, the first portion DM1 of the dummy cell area DMA may have the first width w11 in the first horizontal direction X, and the second portion DM2 of the dummy cell area DMA may have the second width w12 in the first horizontal direction X, which is greater than the first width w11. The number of bit lines BL arranged in the first horizontal direction X in the first portion DM1 of the dummy cell area DMA may be different from the number of bit lines BL arranged in the first horizontal direction X in the second portion DM2 of the dummy cell area DMA. In some example embodiments, the number of bit lines BL arranged in the first horizontal direction X in the first portion DM1 of the dummy cell area DMA may be one less than the number of bit lines BL arranged in the first horizontal direction X in the second portion DM2 of the dummy cell area DMA.

A plurality of direct contacts DC may be formed in a plurality of direct contact holes DCH in the substrate 110, respectively. The direct contacts DC may be connected to a plurality of first active regions AC1, respectively. The direct contacts DC may include doped polysilicon. The direct contacts DC may include polysilicon that includes N-type impurities, such as phosphorous (P), arsenic (As), bismuth (Bi), and antimony (Sb), at a relatively high concentration.

The bit lines BL may extend in the second horizontal direction Y above the substrate 110 and the direct contacts DC. Each of the bit lines BL may be connected to a first active region AC1 through a direct contact DC. Each of the bit lines BL may include a lower conductive pattern 132A, a middle conductive pattern 134A, and an upper conductive pattern 136A, which are sequentially stacked on the substrate 110. The lower conductive pattern 132A may include doped polysilicon. The middle conductive pattern 134A and the upper conductive pattern 136A may include TiN, TiSiN, W, tungsten silicide, or a combination thereof. In some example embodiments, the middle conductive pattern 134A may include TiN, TiSiN, or a combination thereof, and the upper conductive pattern 136A may include W.

The bit lines BL may be covered with a plurality of insulating capping structures 140. The insulating capping structures 140 may extend in the second horizontal direction Y on the bit lines BL. Each of the insulating capping structures 140 may include a lower capping pattern 142A, a protective layer pattern 144A, and an upper capping pattern 146A.

A spacer 150A may be on both side walls of each of the bit lines BL. The spacer 150A may extend in the second horizontal direction Y on both side walls of a bit line BL, and a portion of the spacer 150A may extend into a direct contact hole DCH and cover both side walls of the direct contact DC. It is illustrated in FIG. 7 that the spacer 150A is a single material layer. However, in some example embodiments, the spacer 150A may have a stack structure of multiple spacer layers (not shown), and at least one of the spacer layers may be an air spacer.

The direct contact DC may be formed in the direct contact hole DCH in the substrate 110 and extend to a higher level than the top surface of the substrate 110. For example, the top surface of the direct contact DC may be at the same level as the top surface of the lower conductive pattern 132A and in contact with the bottom surface of the middle conductive pattern 134A. The bottom surface of the direct contact DC may be at a lower level than the top surface of the substrate 110.

A plurality of buried contacts BC may be formed between two adjacent bit lines BL. A plurality of landing pads LP may be on the buried contacts BC, respectively. The buried contacts BC and the landing pads LP may connect the first active region AC1 to a lower electrode 182 of a capacitor structure 180 above the bit lines BL. Each of the landing pads LP may partially overlap with a buried contact BC.

A plurality of insulating fences 154 and a plurality of buried contacts BC may be alternately arranged in the second horizontal direction Y among the bit lines BL. Each of the insulating fences 154 may be on the gate capping layer 126 in an upper portion of the word line trench 120T, and each of the buried contacts BC may extend long in a vertical direction Z from a recess RS1 in the substrate 110. Both side walls of each of the buried contacts BC may be insulated from each other in the second horizontal direction Y by the insulating fences 154.

The landing pads LP may be formed on the buried contacts BC. Although not shown, a metal silicide film (not shown) may be between the buried contacts BC and the landing pads LP. The metal silicide film may include cobalt silicide, nickel silicide, or manganese silicide. Each of the landing pads LP may include a conductive barrier film 162A and a landing pad conductive layer 164A. The conductive barrier film 162A may include Ti, TiN, or a combination thereof. The landing pad conductive layer 164A may be in direct contact with the top surface of the protective layer pattern 144A on a bit line BL. The landing pad conductive layer 164A may include metal, metal nitride, conductive polysilicon, or a combination thereof. For example, the landing pad conductive layer 164A may include tungsten (W). The landing pads LP may be formed in islands pattern in a plan view. The landing pads LP may be electrically insulated from each other by an insulating pattern 166 surrounding each of the landing pads LP. The insulating pattern 166 may include at least one selected from the group consisting of silicon nitride, silicon oxide, and silicon oxynitride.

In the cell area CEA and the dummy cell area DMA, a first etch stop film 172 may be on a landing pad LP and the insulating pattern 166. The capacitor structure 180 may be on the first etch stop film 172. The capacitor structure 180 may include a plurality of lower electrodes 182, a capacitor dielectric layer 184, and an upper electrode 186.

The lower electrodes 182 may pass through the first etch stop film 172 and extend in the vertical direction Z on the landing pads LP, respectively. A bottom portion of each of the lower electrodes 182 may pass through the first etch stop film 172 and may be connected to a landing pad LP. The capacitor dielectric layer 184 may be on the lower electrodes 182. The upper electrode 186 may be on the capacitor dielectric layer 184 and cover the lower electrodes 182.

In some example embodiments, the capacitor dielectric layer 184 may include at least one selected from the group consisting of aluminum oxide, silicon oxide, zirconium oxide, hafnium oxide, titanium oxide, niobium oxide, tantalum oxide, yttrium oxide, strontium titanium oxide, barium strontium titanium oxide, scandium oxide, and lanthanum oxide. The lower electrodes 182 and the upper electrode 186 may include at least one selected from the group consisting of metal, such as ruthenium (Ru), titanium (Ti), tantalum (Ta), niobium (Nb), iridium (Ir), molybdenum (Mo), and tungsten (W), conductive metal nitride, such as titanium nitride (TiN), tantalum nitride (TaN), niobium nitride (NbN), molybdenum nitride (MoN), or tungsten nitride (WN), and conductive metal oxide, such as iridium oxide ($IrO_2$), ruthenium oxide ($RuO_2$), or strontium ruthenium oxide ($SrRuO_3$).

In some example embodiments, each of the lower electrodes 182 may have a pillar shape extending in the vertical direction Z and a circular horizontal cross-section. However, the horizontal cross-section of each of the lower electrodes 182 is not limited to a circular shape and may have various polygonal or round polygonal shapes such as an oval, a quadrangle, a round quadrangle, a diamond, and a trapezoid. It is illustrated in FIG. 7 that each of the lower electrodes 182 has a pillar shape having a circular horizontal cross-section throughout the full height thereof. However, in some example embodiments, each of the lower electrodes 182 may have a cylindrical shape with the closed bottom.

A boundary trench BT may be in the substrate 110 between the peripheral circuit area PCA and the dummy cell area DMA, and a boundary structure BIS may be in the boundary trench BT. The boundary structure BIS may include at least one insulating layer including silicon oxide, silicon nitride, or silicon oxynitride.

In the peripheral circuit area PCA, the peripheral transistor PTR may be on a third active region AC3. The peripheral transistor PTR may include a gate dielectric layer 116, a peripheral gate electrode PGS, and a gate capping pattern 142B, which are sequentially stacked on the third active region AC3.

The gate dielectric layer 116 may include at least one selected from the group consisting of a silicon oxide film, a silicon nitride film, a silicon oxynitride film, an ONO film, and a high-k dielectric film having a higher dielectric constant than a silicon oxide film. The peripheral gate electrode PGS may include a lower conductive pattern 132B, a middle conductive pattern 134B, and an upper conductive pattern 136B. The materials of the lower conductive pattern 132B, the middle conductive pattern 134B, and the upper conductive pattern 136B may be the same as the materials of the lower conductive pattern 132A, the middle conductive pattern 134A, and the upper conductive pattern 136A of the bit line BL in the cell area CEA respectively. The gate capping pattern 142B may include a silicon nitride film.

Both side walls of each of the peripheral gate electrode PGS and the gate capping pattern 142B may be covered with an insulating spacer 150B. The insulating spacer 150B may include an oxide film, a nitride film, or a combination thereof. The peripheral transistor PTR and the insulating spacer 150B may be covered with a protective layer 144B. A first interlayer insulating film 156 may be formed on the protective layer 144B and fill a space between two adjacent peripheral transistors PTR. The top surface of the first interlayer insulating film 156 may be coplanar with the top surface of the protective layer 144B on the top surface of a peripheral transistor PTR. A capping insulating layer 146B may be on the first interlayer insulating film 156 and the protective layer 144B.

In the peripheral circuit area PCA, a contact plug CP may be formed in a contact hole CPH, which passes through the first interlayer insulating film 156 and the capping insulating layer 146B in the vertical direction Z. Similar to the landing pads LP in the cell area CEA, the contact plug CP may include a conductive barrier film 162B and a landing pad conductive layer 164B. A metal silicide film (not shown) may be between the third active region AC3 and the contact plug CP.

In the peripheral circuit area PCA, the first or second word line contact WLC1 or WLC2 may be in a word line contact hole WLCH, which passes through the first interlayer insulating film 156, the capping insulating layer 146B, and the gate capping layer 126 in the vertical direction Z. The first word line contact WLC1 may be on the first landing area LA1 of the first word line WL1, and the second word line contact WLC2 may be on the second landing area LA2 of the second word line WL2. Like the contact plug CP, each of the first and second word line contacts WLC1 and WLC2 may include the conductive barrier film 162B and the landing pad conductive layer 164B.

A second etch stop film 174 may be on the capping insulating layer 146B and cover the contact plug CP. A second interlayer insulating film 190 may be on the second etch stop film 174 and cover the capacitor structure 180.

In a conventional art, a cell block may have a symmetrical structure, and a big active region may be formed in an outermost periphery of a dummy cell area due to a loading effect. As a result, a word line between two big active regions may have a narrow width. In this case, opposite end portions of each of a plurality of first word lines may have a relatively narrow width, and opposite end portions of each of a plurality of second word lines may have a relatively wide width. When each of the first word lines has disconnected portions in the opposite end portions thereof, all rows of memory cells of the first word lines may not be electrically connected to a sub word line driver circuit.

However, according to some example embodiments, the first portion DM1 of the dummy cell area DMA on the first side of the cell block MCA and the second portion DM2 of the dummy cell area DMA on the second side of the cell block MCA may have different widths from each other or include different numbers of second active regions AC from each other. Accordingly, even when the width of each of the first and second word lines WL1 and WL2 between big active regions AC2*b* decreases because the big active regions AC2*b* are formed by a loading effect in an outermost periphery of the dummy cell area DMA, the first word line contact WLC1 may be formed on the first landing area LA1 having a relatively wide width, and the second word line contact WLC2 may be formed on the second landing area LA2 having a relatively wide width, and therefore, failure caused by disconnected portions in the first and second word lines WL1 and WL2 may be mitigated or prevented.

Figure 9:
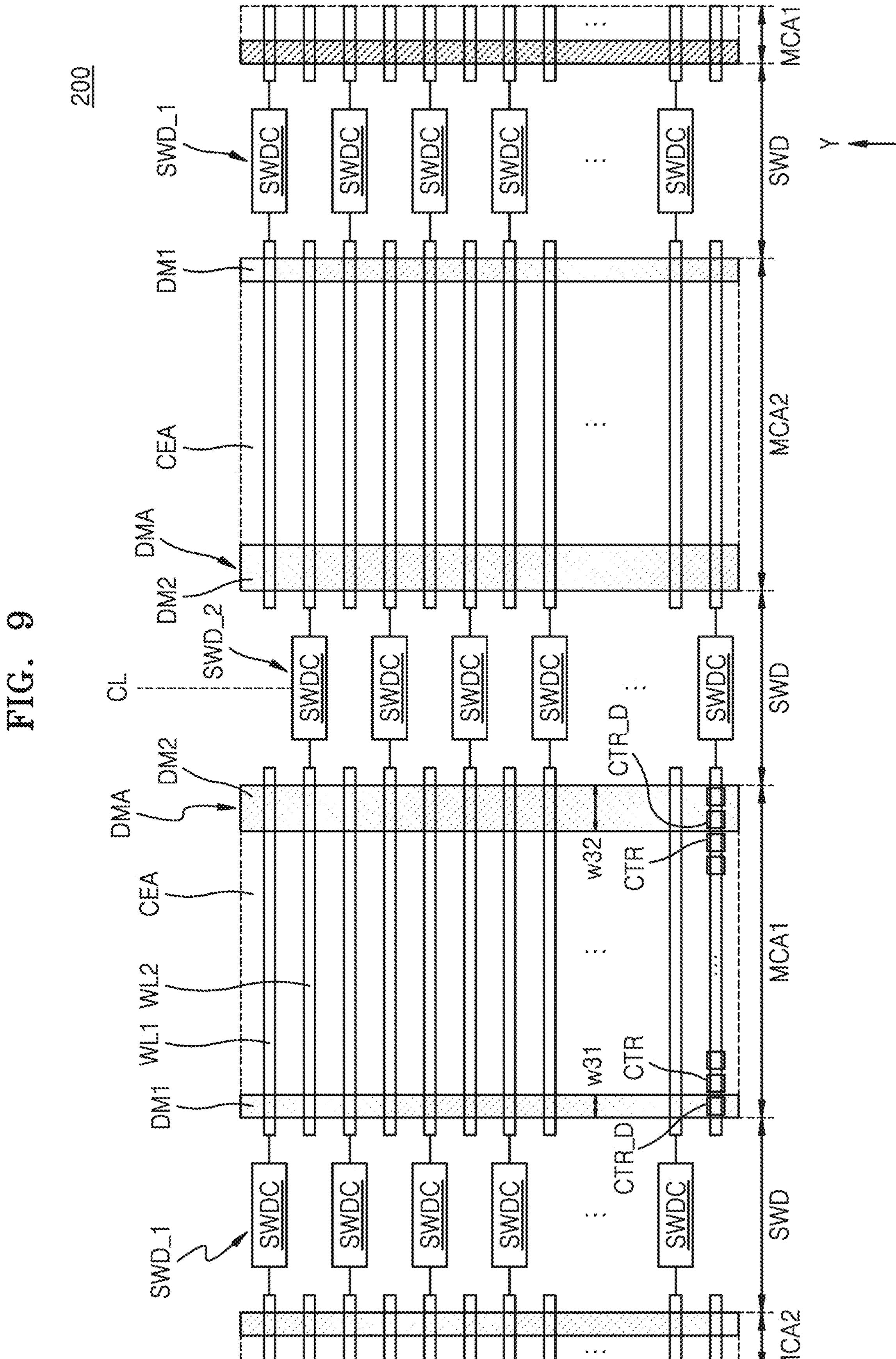
FIG. 9 is a layout diagram of an integrated circuit device according to an example embodiment.
Figure 10:
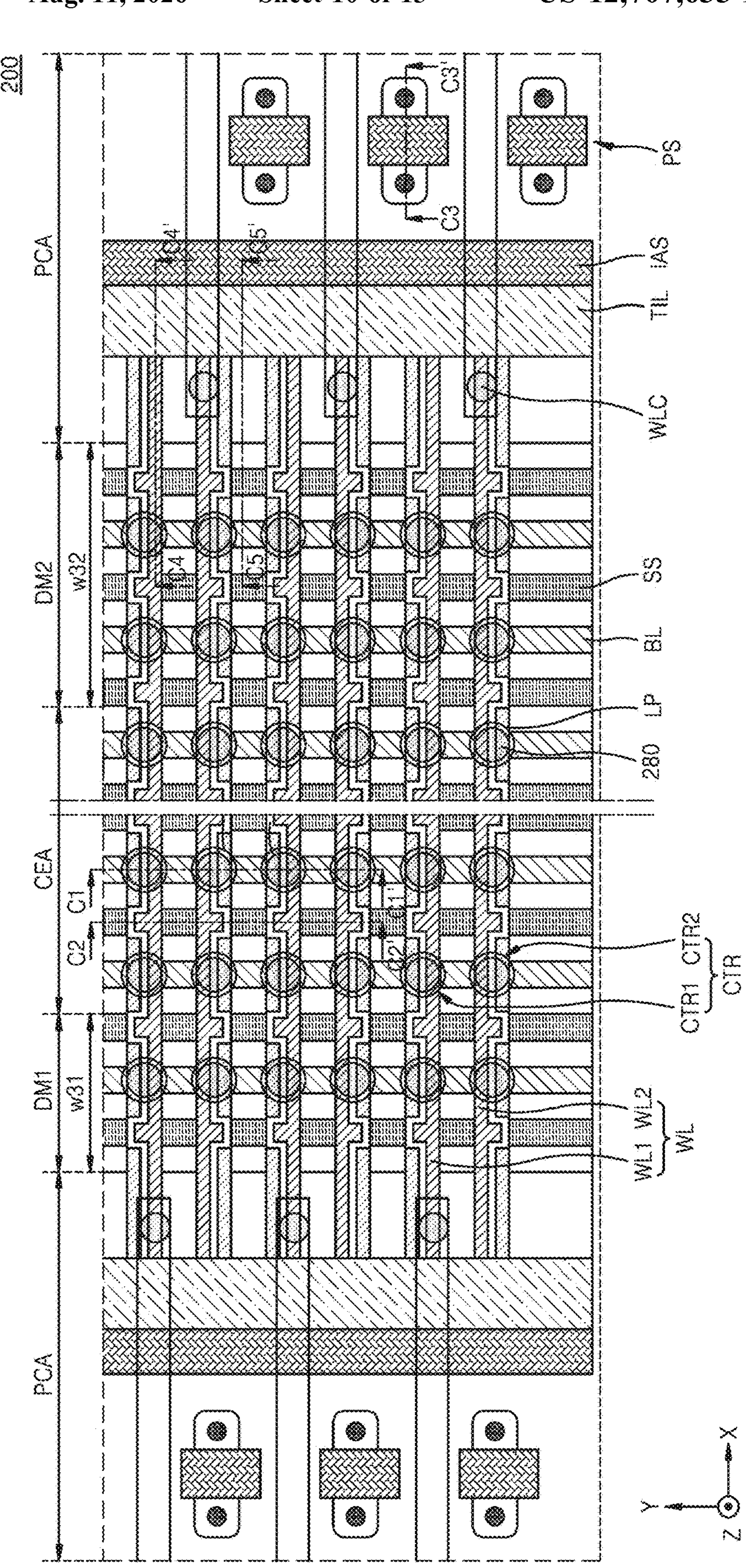
FIG. 10 is an enlarged layout diagram of a portion of a first cell block in FIG. 9.
Figure 11:
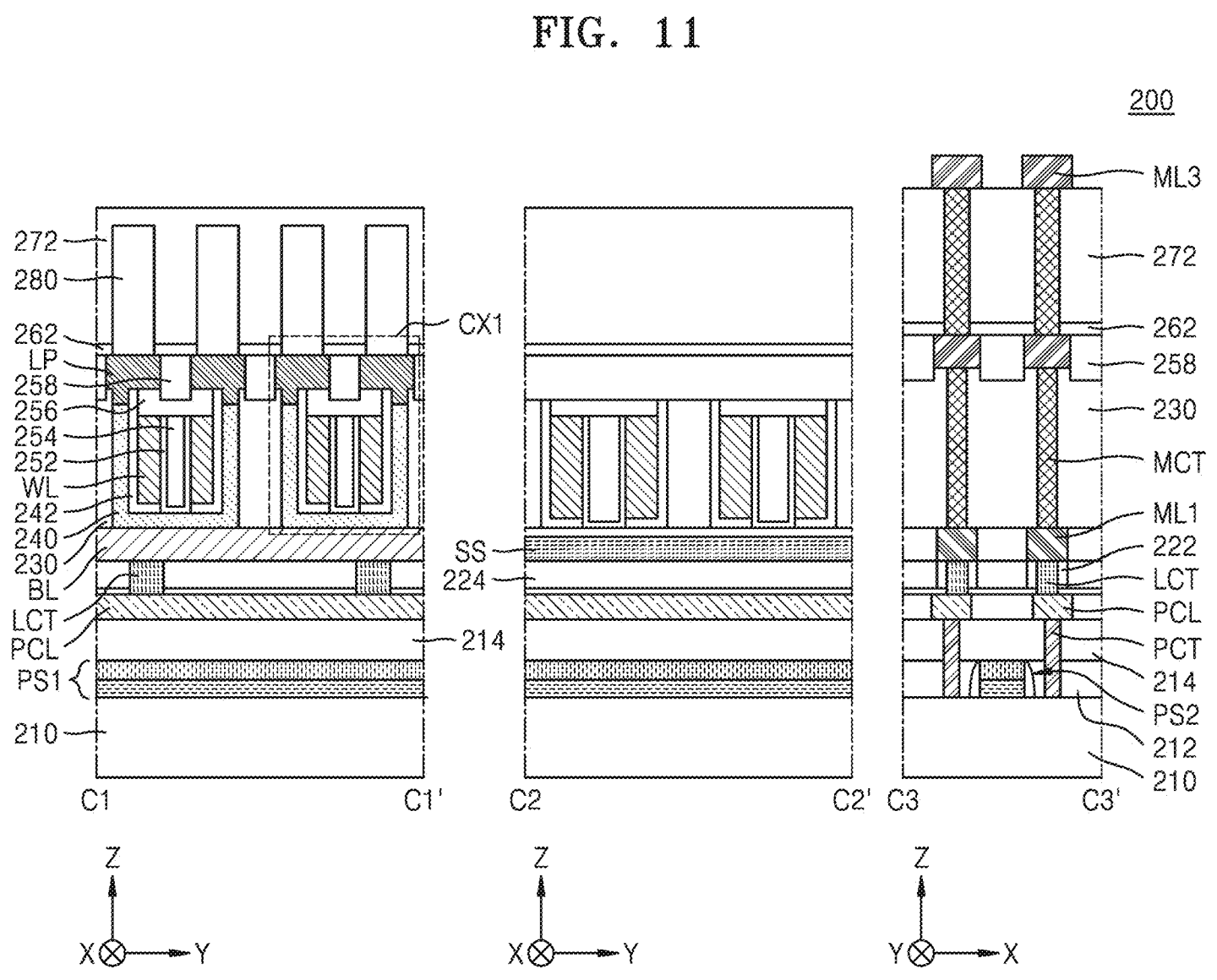
Figure 13:
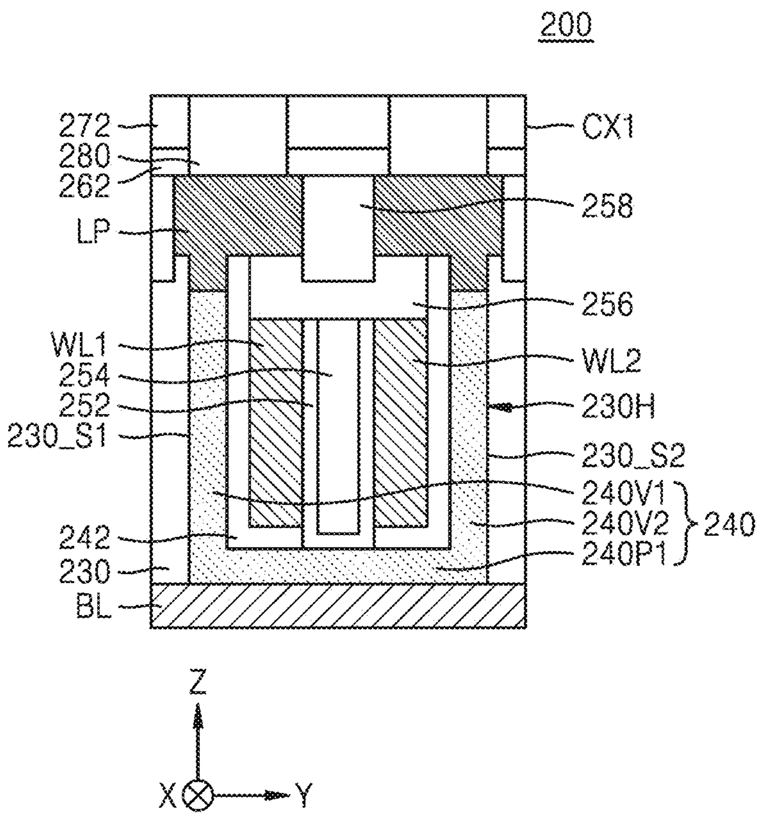
FIG. 13 is an enlarged cross-sectional view of a region CX1 in FIG. 11.

FIG. 9 is a layout diagram of an integrated circuit device 200 according to an example embodiment. FIG. 10 is an enlarged layout diagram of a portion of a first cell block MCA1 in FIG. 9. FIG. 11 illustrates cross-sections taken along lines C1-C1', C2-C2', and C3-C3' in FIG. 10, respectively. FIG. 12 illustrates cross-sections taken along lines C4-C4' and C5-C5' in FIG. 10, respectively. FIG. 13 is an enlarged cross-sectional view of a region CX1 in FIG. 11.

Referring to FIGS. 9 to 13, a first cell block MCA1 and a second cell block MCA2 may be on a substrate 210, and a sub-word line driver block SWD may be between the first and second cell blocks MCA1 and MCA2. First and second portions DM1 and DM2 of a dummy cell area DMA, which are in opposite sides of the first cell block MCA1, respectively, may have different widths from each other. The first cell block MCA1 and the second cell block MCA2 may be mirror-symmetrical with respect to a center line CL. For example, the first portion DM1 of the dummy cell area DMA may have a first width w31, and the second portion DM2 of the dummy cell area DMA may have a second width w32 that is greater than the first width w31.

A plurality of word lines WL extending in the first horizontal direction X and a plurality of bit lines BL extending in the second horizontal direction Y may be in the cell area CEA and the dummy cell area DMA. A plurality of cell transistors CTR may be at the intersections between the word lines WL and the bit lines BL, respectively. A plurality of capacitor structures 280 may be on the cell transistors CTR, respectively.

The word lines WL may include a first word line WL1 and a second word line WL2, which alternate with each other in the second horizontal direction Y. The cell transistors CTR may include a first cell transistor CTR1 and a second cell transistor CTR2, which alternate with each other in the second horizontal direction Y. The first cell transistor CTR1 may be on the first word line WL1, and the second cell transistor CTR2 may be on the second word line WL2. Each of the first cell transistor CTR1 and the second cell transistor CTR2 may have a vertical channel transistor structure including a channel extending in the vertical direction Z.

A dummy cell transistor CTR_D may be arranged in the dummy cell area DMA. The dummy cell transistor CTR_D may have the same structure as a cell transistor CTR but may not be used to store data. The number of dummy cell transistors CTR_D in the first portion DM1 of the dummy cell area DMA may be different from the number of dummy cell transistors CTR_D in the second portion DM2 of the dummy cell area DMA. For example, the number of dummy cell transistors CTR_D in the first portion DM1 of the dummy cell area DMA may be an odd number, and the number of dummy cell transistors CTR_D in the second portion DM2 of the dummy cell area DMA may be an even number. The number of dummy cell transistors CTR_D in the first portion DM1 of the dummy cell area DMA may be one less than the number of dummy cell transistors CTR_D in the second portion DM2 of the dummy cell area DMA. In some example embodiments, the number of active semiconductor layers 240 arranged in the first horizontal direction X in the first portion DM1 of the dummy cell area DMA may be one less than the number of active semiconductor layers 240 arranged in the first horizontal direction X in the second portion DM2 of the dummy cell area DMA.

The word lines WL may be arranged across the cell area CEA and the dummy cell area DMA and may extend to a peripheral circuit area PCA. As shown in FIG. 10, end portions of the word lines WL may be arranged in the peripheral circuit area PCA.

In the peripheral circuit area PCA, a peripheral structure PS may be arranged on the substrate 210. In the cell area CEA, the cell transistors CTR and the capacitor structures 280 may be arranged at a height higher that the peripheral structure PS.

The peripheral structure PS may include core circuits PS1 and peripheral circuits PS2. For example, the core circuits PS1 may include a sense amplifier in the cell area CEA, and the peripheral circuits PS2 may include a word line driver and/or a control logic in the peripheral circuit area PCA. The peripheral structure PS may include an N-channel metal-oxide semiconductor (NMOS) transistor and a P-channel MOS (PMOS) transistor on the substrate 210. For example, the peripheral structure PS may be electrically connected to a bit line BL or a word line WL through a peripheral circuit line PCL and a peripheral circuit contact PCT.

A lower insulating layer 212 may be on the substrate 210 and cover the side wall of the peripheral structure PS, and a peripheral insulating layer 214 may be on the lower insulating layer 212 and cover the top surface of the peripheral structure PS and a side wall of the peripheral circuit contact PCT. Each of the lower insulating layer 212 and the peripheral insulating layer 214 may include an oxide film, a nitride film, a low-k dielectric film, or a combination thereof and have a stack structure of a plurality of insulating layers.

The bit line BL extending in the second horizontal direction Y may be on the peripheral insulating layer 214. In some example embodiments, the bit line BL may include Ti, TiN, Ta, TaN, Mo, Ru, W, WN, Co, Ni, TiSi, TiSiN, WSi, WSiN, TaSi, TaSiN, RuTiN, CoSi, NiSi, polysilicon, or a combination thereof. The bit line BL may be connected to the peripheral circuit line PCL through a line contact plug LCT.

A lower interconnection line ML1 may be arranged in the peripheral circuit area PCA to be at the same level as the bit line BL. The lower interconnection line ML1 may be connected to the peripheral circuits PS2 through the line contact plug LCT and may include the same material as the bit line BL.

A first insulating layer 222 surrounding the line contact plug LCT may be between the bit line BL and the peripheral circuit line PCL and between the lower interconnection line ML1 and the peripheral circuit line PCL. A second insulating layer 224 may be between bit lines BL. Each of the first and second insulating layers 222 and 224 may include an oxide film, a nitride film, a low-k dielectric film, or a combination thereof.

A shielding structure SS may extend in the second horizontal direction Y between the bit lines BL. The shielding structure SS may include a conductive material like metal and may be surrounded by the second insulating layer 224. The top surface of the shielding structure SS may be at a lower level than the top surface of each of the bit lines BL. In some example embodiments, the shielding structure SS may include a conductive material and have an air gap or a void therein. In some example embodiments, air gaps may be defined in the second insulating layer 224 instead of the shielding structure SS.

A mold insulating layer 230 may be on the bit line BL and the second insulating layer 224. The mold insulating layer 230 may include a plurality of openings 230H. Each of the openings 230H of the mold insulating layer 230 may extend in the first horizontal direction X. The top surface of the bit line BL may be exposed on the bottom of each of the openings 230H. Each of the openings 230H may include a first side wall 230_S1 and a second side wall 230_S2, which are apart from each other in the second horizontal direction Y. The first and second side walls 230_S1 and 230_S2 of each opening 230H may extend in the first horizontal direction X in parallel with each other. The mold insulating layer 230 may include an oxide film, a nitride film, a low-k dielectric film, or a combination thereof.

A plurality of active semiconductor layers 240 may be arranged on the inside wall of the opening 230H. An active semiconductor layer 240 of the first cell transistor CTR1 may be arranged on the first side wall 230_S1 and the bottom of the opening 230H, and an active semiconductor layer 240 of the second cell transistor CTR2 may be arranged on the second side wall 230_S2 and the bottom of the opening 230H.

The active semiconductor layers 240 may include a first vertical extension 240V1, a second vertical extension 240V2, and a horizontal extension 240P1. For example, the active semiconductor layers 240 may have a U-shaped vertical cross-section.

The first vertical extension 240V1 and a portion of the horizontal extension 240P1 of an active semiconductor layer 240 may function as a channel region of the first cell transistor CTR1, and the second vertical extension 240V2 and the other portion of the horizontal extension 240P1 of the active semiconductor layer 240 may function as a channel region of the second cell transistor CTR2. A portion of the horizontal extension 240P1 may be in contact with the top surface of the bit line BL and may function as a contact region shared by the first and second cell transistors CTR1 and CTR2.

In some example embodiments, the active semiconductor layers 240 may include an oxide semiconductor material. For example, the active semiconductor layers 240 may include a material having a greater band gap than polysilicon, for example, a material having a band gap exceeding 1.65 eV. In some example embodiments, the active semiconductor layers 240 may include at least one selected from the group consisting of zinc tin oxide ($Zn_xSn_yO$), indium zinc oxide ($In_xZn_yO$), zinc oxide ($ZnO_x$), indium gallium zinc oxide ($In_xGa_yZn_zO$), indium gallium silicon oxide ($In_xGa_ySi_zO$), indium tungsten oxide ($In_xW_yO$), indium oxide ($In_xO$), tin oxide ($Sn_xO$), titanium oxide ($Ti_xO$), zinc oxynitride ($Zn_xON_z$), magnesium zinc oxide ($Mg_xZn_yO$), zirconium indium zinc oxide ($Zr_xIn_yZn_zO$), hafnium indium zinc oxide ($Hf_xIn_yZn_zO$), tin indium zinc oxide ($Sn_xIn_yZn_zO$), aluminum tin indium zinc oxide ($Al_xSn_yIn_zZn_aO$), silicon indium zinc oxide ($Si_xIn_yZn_zO$), aluminum zinc tin oxide ($Al_xZn_ySn_zO$), gallium zinc tin oxide ($Ga_xZn_ySn_zO$), and zirconium zinc tin oxide ($Zr_xZn_ySn_zO$). In some example embodiments, the active semiconductor layers 240 may include two-dimensional (2D) semiconductor material, which may include graphene, a carbon nanotube, or a combination thereof.

A gate insulating layer 242 may be on the inside walls of the active semiconductor layers 240. For example, the gate insulating layer 242 may be conformally disposed on the first vertical extension 240V1, the second vertical extension 240V2, and the horizontal extension 240P1 of the active semiconductor layers 240.

In some example embodiments, the gate insulating layer 242 may include at least one of a ferroelectric material and a high-k dielectric material having a higher dielectric constant than silicon oxide. In some example embodiments, the gate insulating layer 242 may include at least one selected from the group consisting of hafnium oxide (HfO), hafnium silicate (HfSiO), hafnium oxynitride (HfON), hafnium silicon oxynitride (HfSiON), lanthanum oxide (LaO), lanthanum aluminum oxide (LaAlO), zirconium oxide (ZrO), zirconium silicate (ZrSiO), zirconium oxynitride (ZrON), zirconium silicon oxynitride (ZrSiON), tantalum oxide (TaO), titanium oxide (TiO), barium strontium titanium oxide (BaSrTiO), barium titanium oxide (BaTiO), lead zirconate titanate (PZT), strontium bismuth tantalate (STB), bismuth iron oxide (BFO), strontium titanium oxide (SrTiO), yttrium oxide (YO), aluminum oxide (AlO), and lead scandium tantalum oxide (PbScTaO).

Word lines WL may be disposed on the gate insulating layer 242. The word lines WL may be at the respective sides of the first and second vertical extensions 240V1 and 240V2 of the active semiconductor layers 240, respectively. In some example embodiments, the word lines WL may include Ti, TiN, Ta, TaN, Mo, Ru, W, WN, TiSiN, WSiN, polysilicon, or a combination thereof.

An insulating liner 252 may be on respective side walls of two word lines WL, which are apart from each other in the opening 230H. A buried insulating layer 254 may be on the insulating liner 252 and fill the space between the word lines WL. The insulating liner 252 may be conformally arranged on the respective side walls of the word lines WL (e.g., the first word line WL1 and the second word line WL2), wherein the respective side walls of the word lines WL face each other. The top surface of the insulating liner 252 may be coplanar with the top surface of each of the word lines WL. For example, the insulating liner 252 may include silicon nitride, and the buried insulating layer 254 may include silicon oxide.

An upper insulating layer 256 may be on the word lines WL and the buried insulating layer 254 in the opening 230H. The top surface of the upper insulating layer 256 may be at the same level as the top surface of the mold insulating layer 230.

A landing pad LP may be on the upper insulating layer 256 and in contact with the top surface of an active semiconductor layer 240. A landing pad insulating layer 258 may be on the mold insulating layer 230 and the upper insulating layer 256 and surround the landing pad LP.

As shown in FIG. 11, in some example embodiments, the landing pad LP may have a T-shaped vertical cross-section. In some example embodiments, the landing pad LP may include Ti, TiN, Ta, TaN, W, WN, TiSiN, WSiN, polysilicon, or a combination thereof.

An etch stop film 262 may be on the landing pad LP and the landing pad insulating layer 258. A capacitor structure 280 may be on the landing pad LP and the etch stop film 262, and an interlayer insulating film 272 may be on the capacitor structure 280. In some example embodiments, the capacitor structure 280 may include a lower electrode (not shown), a capacitor dielectric layer (not shown), and an upper electrode (not shown). However, other types of memory storage components may be arranged in place of the capacitor structure 280. For example, memory storage components may include a variable resistance memory component, a phase-change memory component, a magnetic memory component, and the like.

In some example embodiments, in the peripheral circuit area PCA, an interface interconnection structure IAS may be at the same vertical level as the bit line BL. In a plan view, the interface interconnection structure IAS may surround the cell area CEA. The interface interconnection structure IAS may include the same material as the bit line BL but is not limited thereto.

In the peripheral circuit area PCA, a trimming insulation block TIL may be connected to respective ends of a plurality of word lines WL. For example, the word lines WL may extend from the cell area CEA and the dummy cell area DMA to the peripheral circuit area PCA in the first horizontal direction X, and the respective end portions of the word lines WL may be in the peripheral circuit area PCA. The trimming insulation block TIL may be in a trimming block opening TILH, which extends in the second horizontal direction Y and crosses a plurality of openings 230H of the mold insulating layer 230. The trimming insulation block TIL may include silicon oxide, silicon nitride, silicon oxynitride, or a combination thereof.

In the peripheral circuit area PCA, a word line contact WLC may be on each of the word lines WL, and a routing line ML2 may be on the word line contact WLC. For example, the word line contact WLC on the first word line WL1 may be near the first portion DM1 of the dummy cell area DMA, and the word line contact WLC on the second word line WL2 may be near the second portion DM2 of the dummy cell area DMA. The routing line ML2 may be at the same vertical level as the landing pad LP and include the same material as the landing pad LP.

A contact plug MCT and an upper interconnection line ML3 connected to the contact plug MCT may be arranged in the peripheral circuit area PCA. The contact plug MCT passes through the mold insulating layer 230 or the interlayer insulating film 272 and is electrically connected to the lower interconnection line ML1.

The first portion DM1 of the dummy cell area DMA on the first side of the cell block MCA and the second portion DM2 of the dummy cell area DMA on the second side of the cell block MCA may have different widths from each other. For example, the number of dummy cell transistors CTR_D in the first portion DM1 of the dummy cell area DMA may be different from the number of dummy cell transistors CTR_D in the second portion DM2 of the dummy cell area DMA. Accordingly, even when failure occurs during a process of forming the trimming insulation block TIL because of a loading effect outside the dummy cell area DMA, failure caused by disconnected portions in the first and second word lines WL1 and WL2 may be mitigated or prevented.

While the inventive concepts have been particularly shown and described with reference to some example embodiments thereof, it will be understood that various changes in form and details may be made therein without departing from the spirit and scope of the following claims.

What is claimed is:

1. An integrated circuit device comprising:

a first cell block on a substrate, the first cell block including, a first cell area, a first dummy cell area surrounding the first cell area in a plan view, the first dummy cell area including a plurality of first active regions and a plurality of second active regions in a first outer periphery of the first dummy cell area, the plurality of first active regions each having a first size and the plurality of second active regions each having a second size larger than the first size, a plurality of first word lines and a plurality of second word lines in the first cell area and the first dummy cell area, the plurality of first word lines and the plurality of second word lines extending in a first horizontal direction and alternating with each other in a second horizontal direction, each of the plurality of first word lines including a first landing area extending between a first-second active region among the plurality of second active regions and a first-first active region among the plurality of first active regions, the first-first active region being near and spaced apart from the first-second active region in the second horizontal direction, and a plurality of first word line contacts in the first dummy cell area, each of the plurality of first word line contacts being on the first landing area of a first corresponding one of the plurality of first word lines.

2. The integrated circuit device of claim 1, wherein each of the plurality of second word lines includes a neck portion spaced apart in the second horizontal direction from the first landing area of a second corresponding one of the plurality of first word lines, and the neck portion extends between the first-second active region and a second-second active region among the plurality of second active regions, the second-second active region being near and apart in the second horizontal direction from the first-second active region.

3. The integrated circuit device of claim 2, wherein each of the plurality of second word lines has a first width in the second horizontal direction, and the neck portion of each of the plurality of second word lines has a second width that is less than the first width, in the second horizontal direction.

4. The integrated circuit device of claim 2, wherein the first dummy cell area includes a first portion and a second portion, the first portion being on a first side of the first cell area, and the second portion being on a second side of the first cell area opposite the first side, the first landing area of each of the plurality of first word lines is in the first portion of the first dummy cell area, and the neck portion of each of the plurality of second word lines is in the first portion of the first dummy cell area.

5. The integrated circuit device of claim 4, wherein each of the plurality of second word lines further includes a second landing area in the second portion of the first dummy cell area, the second landing area extends between a third-second active region among the plurality of second active regions and a second-first active region among the plurality of first active regions, the second-first active region being near and apart from the third-second active region in the second horizontal direction, and the first cell block further includes a plurality of second word line contacts, each of the plurality of second word line contacts being on the second landing area of a third corresponding one of the plurality of second word lines in the second portion of the first dummy cell area.

6. The integrated circuit device of claim 4, wherein the first portion of the first dummy cell area has a third width in the first horizontal direction, and the second portion of the first dummy cell area has a fourth width that is greater than the third width, in the first horizontal direction.

7. The integrated circuit device of claim 1, further comprising:

a second cell block on the substrate, the second cell block being in mirror symmetry with the first cell block.

8. The integrated circuit device of claim 7, wherein the second cell block includes:

a second cell area;

a second dummy cell area including a plurality of third active regions and a plurality of fourth active regions in a second outer periphery of the second dummy cell area, the plurality of third active regions each having a third size and the plurality of fourth active regions each having a fourth size larger than the third size;

a plurality of third word lines and a plurality of fourth word lines in the second cell area and the second dummy cell area, the plurality of third word lines and the plurality of fourth word lines extending in the first horizontal direction and alternating with each other in the second horizontal direction; and a plurality of third word line contacts in the second dummy cell area, each of the plurality of third word line contacts being on a fourth corresponding one of the plurality of third word lines.

9. The integrated circuit device of claim 8, further comprising:

a sub-word line driver block between the first cell block and the second cell block, wherein the sub-word line driver block includes a first sub-word line driver circuit electrically connected to one of the plurality of first word lines of the first cell block and one of the plurality of third word lines of the second cell block.

10. An integrated circuit device comprising:

a cell area on a substrate;

a dummy cell area on the substrate and including a first portion on a first side of the cell area and a second portion on a second side of the cell area;

a plurality of first word lines and a plurality of second word lines in the cell area and the dummy cell area, the plurality of first word lines and the plurality of second word lines extending in a first horizontal direction and alternating with each other in a second horizontal direction;

a plurality of first word line contacts in the first portion of the dummy cell area, the plurality of first word line contacts being on the plurality of first word lines, respectively;

a plurality of second word line contacts in the second portion of the dummy cell area, the plurality of second word line contacts being on the plurality of second word lines, respectively; and a plurality of active regions in the dummy cell area, wherein a first number of the plurality of active regions arranged in the first horizontal direction in the first portion of the dummy cell area is different from a second number of the plurality of active regions arranged in the first horizontal direction in the second portion of the dummy cell area.

11. The integrated circuit device of claim 10, wherein the first number is 2n, and the second number is 2n+1, where n is a positive integer.

12. The integrated circuit device of claim 10, wherein the plurality of active regions include a plurality of first active regions and a plurality of second active regions arranged in the dummy cell area, the plurality of first active regions each having a first size and the plurality of second active regions each having a second size larger than the first size, each of the plurality of first word lines includes a first landing area in the first portion of the dummy cell area, the first landing area extending between a first-second active region among the plurality of second active regions and a first-first active region among the plurality of first active regions, the first-first active region being near and spaced apart from the first-second active region in the second horizontal direction, and each of the plurality of second word lines includes a second landing area in the second portion of the dummy cell area, the second landing area extending between a second-second active region among the plurality of second active regions and a second-first active region among the plurality of first active regions, the second-first active region being near and spaced apart from the second-second active region in the second horizontal direction.

13. The integrated circuit device of claim 12, wherein each of the plurality of first word line contacts is on the first landing area of a first corresponding one of the plurality of first word lines, and each of the plurality of second word line contacts is on the second landing area of a second corresponding one of the plurality of second word lines.

14. The integrated circuit device of claim 13, wherein each of the plurality of second word lines includes a neck portion spaced apart in the second horizontal direction from the first landing area of a third corresponding one of the plurality of first word lines, and the neck portion extends between the first-second active region and a third-second active region among the plurality of second active regions, the third-second active region being near and spaced apart in the second horizontal direction from the first-second active region.

15. The integrated circuit device of claim 14, wherein each of the plurality of second word lines has a first width in the second horizontal direction, and the neck portion of each of the plurality of second word lines has a second width that is less than the first width, in the second horizontal direction.

16. The integrated circuit device of claim 10, wherein the first portion of the dummy cell area has a third width in the first horizontal direction, and the second portion of the dummy cell area has a fourth width in the first horizontal direction that is greater than the third width.

17. An integrated circuit device comprising:

a cell area on a substrate;

a dummy cell area on the substrate, the dummy cell area including a first portion on a first side of the cell area and a second portion on a second side of the cell area;

a plurality of first word lines and a plurality of second word lines in the cell area and the dummy cell area, the plurality of first word lines and the plurality of second word lines extending in a first horizontal direction and alternating with each other in a second horizontal direction;

a plurality of first word line contacts in the first portion of the dummy cell area, the plurality of first word line contacts being on the plurality of first word lines, respectively;

a plurality of second word line contacts in the second portion of the dummy cell area, the plurality of second word line contacts being on the plurality of second word lines, respectively;

a first word line driver circuit unit near the first portion of the dummy cell area and electrically connected to the plurality of first word line contacts; and a second word line driver circuit unit near the second portion of the dummy cell area and electrically connected to the plurality of second word line contacts, a plurality of active regions in the dummy cell area, wherein a first number of the plurality of active regions arranged in the first horizontal direction in the first portion of the dummy cell area is 2n, and a second number of the plurality of active regions arranged in the first horizontal direction in the second portion of the dummy cell area is 2n+1, where n is a positive integer.

18. The integrated circuit device of claim 17, wherein the plurality of active regions include a plurality of first active regions and a plurality of second active regions in an outer periphery of the dummy cell area, the plurality of first active regions each having a first size and the plurality of second active regions each having a second size larger than the first size, each of the plurality of first word lines includes a first landing area extending between a first-second active region among the plurality of second active regions and a first-first active region among the plurality of first active regions, the first-first active region being near and spaced apart from the first-second active region in the second horizontal direction, and each of the plurality of first word line contacts is on the first landing area of a first corresponding one of the plurality of first word lines.

19. The integrated circuit device of claim 17, wherein the plurality of active regions include a plurality of first active regions and a plurality of second active regions in an outer periphery of the dummy cell area, the plurality of first active regions each having a first size and the plurality of second active regions each having a second size larger than the first size, each of the plurality of second word lines includes a second landing area in the second portion of the dummy cell area, the second landing area extending between a first-second active region among the plurality of second active regions and a first-first active region among the plurality of first active regions, the first-first active region being near and spaced apart from the first-second active region in the second horizontal direction, and each of the plurality of second word line contacts is on the second landing area of a second corresponding one of the plurality of second word lines.

20. The integrated circuit device of claim 17, wherein the first portion of the dummy cell area has a third width in the first horizontal direction, and the second portion of the dummy cell area has a fourth width in the first horizontal direction that is greater than the third width.

* * * * *